United States Patent
Tsukiyama et al.

(10) Patent No.: US 8,710,654 B2
(45) Date of Patent: Apr. 29, 2014

(54) SEMICONDUCTOR DEVICE AND MANUFACTURING METHOD THEREOF

(75) Inventors: Satoshi Tsukiyama, Yokohama (JP); Masatoshi Fukuda, Yokohama (JP); Hiroshi Watabe, Hino (JP); Keita Mizoguchi, Yokohama (JP); Naoyuki Komuta, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/477,387

(22) Filed: May 22, 2012

(65) Prior Publication Data

US 2013/0134583 A1    May 30, 2013

(30) Foreign Application Priority Data

May 26, 2011    (JP) .................................. 2011-117906

(51) Int. Cl.
*H01L 23/48* (2006.01)
*H01L 29/40* (2006.01)

(52) U.S. Cl.
USPC ........... 257/737; 257/777; 257/686; 257/687; 438/109

(58) Field of Classification Search
USPC ................ 257/737, 686, 687, 673, 777, 778; 438/109
See application file for complete search history.

(56) References Cited

U.S. PATENT DOCUMENTS

| | | | |
|---|---|---|---|
| 6,825,567 B1 * | 11/2004 | Wang et al. .................. | 257/777 |
| 6,966,964 B2 | 11/2005 | Nakamura et al. | |
| 7,187,070 B2 * | 3/2007 | Chu et al. ..................... | 257/686 |
| 2002/0079567 A1 * | 6/2002 | Lo et al. ....................... | 257/685 |
| 2002/0124512 A1 * | 9/2002 | Dean .......................... | 52/506.01 |
| 2005/0121802 A1 * | 6/2005 | Kawano et al. .............. | 257/777 |
| 2005/0173807 A1 * | 8/2005 | Zhu et al. .................... | 257/777 |
| 2006/0030075 A1 | 2/2006 | Sugiyama et al. | |
| 2006/0139893 A1 * | 6/2006 | Yoshimura et al. .......... | 361/735 |
| 2008/0150133 A1 * | 6/2008 | Nakamura et al. ........... | 257/737 |
| 2010/0007001 A1 * | 1/2010 | Wang et al. .................. | 257/686 |
| 2010/0327439 A1 * | 12/2010 | Hwang et al. ................ | 257/737 |

FOREIGN PATENT DOCUMENTS

| | | |
|---|---|---|
| JP | 2003-197853 | 7/2003 |
| JP | 2005-268594 | 9/2005 |
| JP | 2006-49477 | 2/2006 |
| JP | 2008-192815 | 8/2008 |

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

In one embodiment, a semiconductor device includes a first semiconductor chip and a second semiconductor chip stacked on the first semiconductor chip. The first and second semiconductor chips are electrically connected via first bump connection parts. Stopper projections and bonding projections are provided at least one of the first and second semiconductor chips. The stopper projections are in contact with the other of the first and second semiconductor chips in an unbonded state. The bonding projections are bonded to the first and second semiconductor chips.

10 Claims, 21 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Application No. 2011-117906, filed on May 26, 2011; the entire contents of which are incorporated herein by reference.

FIELD

Embodiments described herein relate generally to a semiconductor device and a manufacturing method thereof.

BACKGROUND

A semiconductor device including an SiP (System in Package) structure in which plural semiconductor chips are stacked and sealed in one package is in practical use to enable a miniaturization and a high function of a semiconductor device. In the semiconductor device of the SiP structure, it is required to transmit and receive electrical signals between the semiconductor chips in high speed. In this case, micro-bumps are used for an electrical connection between the semiconductor chips. The micro-bumps each have a diameter of, for example, approximately 5 μm to 50 μm, and are formed on a surface of the semiconductor chip with a pitch of approximately 10 μm to 100 μm.

When the semiconductor chips are connected by using the micro-bumps, the bumps formed at upper and lower semiconductor chips are aligned with each other, and thereafter, the upper and lower semiconductor chips are pressure-bonded while being heated to connect the bumps with each other. An underfill resin is filled into a gap between the upper and lower semiconductor chips to increase connection reliability and so on. When the gap between the chips decreases excessively at the bump connection time, an excessive crush of the bumps and a short circuit in accordance with the crush occur. Accordingly, it is required to keep the gap between the upper and lower semiconductor chips. Further, if a warp occurs at the semiconductor chip after the bump connection, there is a possibility that a connection failure (open failure) occurs between the bumps. Accordingly, it is required to enhance connection strength between the semiconductor chips before the underfill resin is filled.

DETAILED DESCRIPTION

According to one embodiment, a semiconductor device includes: a first semiconductor chip having a first surface including a first connection region and a first non-connection region excluding the first connection region; a second semiconductor chip having a second surface including a second connection region facing the first connection region and a second non-connection region excluding the second connection region and stacked on the first semiconductor chip; connection parts provided between the first connection region of the first surface and the second connection region of the second surface to electrically connect the first semiconductor chip and the second semiconductor chip; stopper projections locally provided at least one region of the first non-connection region of the first surface and the second non-connection region of the second surface, and being in contact with the other region of the first non-connection region and the second non-connection region in an unbonded state; bonding projections locally provided between the first non-connection region of the first surface and the second non-connection region of the second surface, and bonded to the first and second surfaces; and a resin filled into a gap between the first surface of the first semiconductor chip and the second surface of the second semiconductor chip is provided.

First Embodiment

Figure 1:
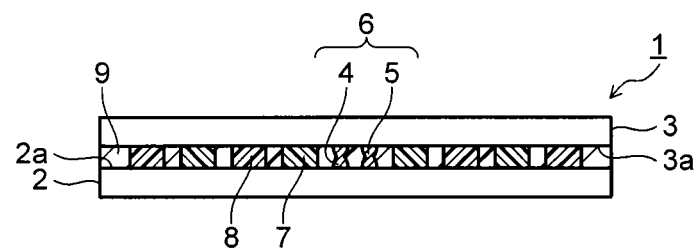
FIG. 1 is a sectional view illustrating a semiconductor device according to a first embodiment.

A semiconductor device and a manufacturing method thereof according to a first embodiment are described with reference to the drawings. FIG. 1 is a view illustrating the semiconductor device according to the first embodiment. FIG. 2A to FIG. 2C, FIG. 3A and FIG. 3B, and FIG. 4 are views illustrating a manufacturing process of the semiconductor device according to the first embodiment. A semiconductor device 1 includes a first semiconductor chip 2 and a second semiconductor chip 3. An upper surface (first surface) 2a of the first semiconductor chip 2 includes a first connection region, and first bumps 4 are formed in the first connection region.

A lower surface (second surface) 3a of the second semiconductor chip 3 includes a second connection region facing the first connection region, and second bumps 5 are formed in the second connection region. The second semiconductor chip 3 is stacked on the first semiconductor chip 2 while connecting the second bumps 5 to the first bumps 4. Namely, the first semiconductor chip 2 and the second semiconductor chip 3 are electrically and mechanically connected via connection bodies (bump connection parts) 6 of the first bumps 4 and the second bumps 5. The connection regions mean formation regions of the bumps 4, 5 at the surfaces 2a, 3a of the semiconductor chips 2, 3. The bumps 4, 5 mean electrodes forming bump connection parts 6 which electrically and mechanically connect the first semiconductor chip 2 and the second semiconductor chip 3.

When the bumps 4, 5 are formed at both of the first and second semiconductor chips 2, 3, combinations such as solder/solder, Au/solder, solder/Au, Au/Au are exemplified as a constitution of the bumps 4, 5. A Pb free solder composed of Sn alloy in which Cu, Ag, Bi, In and so on are added to Sn, is exemplified as the solder forming the bumps 4, 5. Sn—Cu alloy, Sn—Ag alloy, Sn—Ag—Cu alloy, and so on can be cited as concrete examples of the Pb free solder. A metal forming the bumps 4, 5 may be Cu, Ni, Sn, Pd, Ag and so on instead of Au. These metals are limited to a single layer film, and may be a stacked film of plural metals. Projecting shapes such as a hemisphere and a column can be cited as shapes of the bumps 4, 5, but they may be flat shapes such as a pad. A combination of projection bodies with each other, and a combination of the projection body and a flat body can be cited as a combination of the bumps 4, 5.

Stopper projections 7 are locally provided at least one region of a region (a first non-connection region) excluding the first connection region at the upper surface 2a of the first semiconductor chip 2 and a region (a second non-connection region) excluding the second connection region at the lower surface 3a of the second semiconductor chip 3 so that a gap between the first semiconductor chip 2 and the second semiconductor chip 3 becomes a set connection height of the bumps 4, 5 (a set height of the bump connection part 6). Namely, the gap between the first semiconductor chip 2 and the second semiconductor chip 3 is defined by the stopper projections 7 when the first semiconductor chip 2 and the second semiconductor chip 3 are pressure-bonded, and therefore, it is possible to suppress an excessive crush of the bump connection parts 6 and an occurrence of a connection failure (open failure) between the bumps 4, 5 and so on. Tips of the stopper projections 7 are in contact with the other region of the first non-connection region and the second non-connection region in an unbonded state.

Further, bonding projections 8 reinforcing a connection state between the first semiconductor chip 2 and the second semiconductor chip 3 when the first bumps 4 and the second bumps 5 are connected, are locally provided at least one region of the first non-connection region at the upper surface 2a of the first semiconductor chip 2 and the second non-connection region at the lower surface 3a of the second semiconductor chip 3. The bonding projections 8 provided at least one region of the first and second non-connection regions are bonded to the other region of the first and second non-connection regions. The bonding projections 8 are locally provided between the first non-connection region and the second non-connection region, and are each bonded to the upper surface 2a of the first semiconductor chip 2 and the lower surface 3a of the second semiconductor chip 3.

An underfill resin (resin) 9 is filled into the gap between the first semiconductor chip 2 and the second semiconductor chip 3 connected via the bump connection parts 6. The bonding projections 8 are provided between the first non-connection region of the first semiconductor chip 2 and the second non-connection region of the second semiconductor chip 3, and thereby, a connection strength between the first semiconductor chip 2 and the second semiconductor chip 3 before the underfill resin 9 is filled can be increased. Namely, the first semiconductor chip 2 and the second semiconductor chip 3 are connected by the bonding projections 8 in addition to the connection parts 6 of the first bumps 4 and the second bumps 5 before the underfill resin 9 is filled. Accordingly, the connection strength before the underfill resin 9 is filled can be increased.

The bumps 4 provided at the first semiconductor chip 2 and the bumps 5 provided at the second semiconductor chip 3 are connected by, for example, pressure-bonded while being heated. An organic insulating film (insulating film) such as a polyimide resin film is generally provided at each of the surfaces of the semiconductor chips 2, 3 as a protective film. A thermal expansion coefficient of a silicon substrate constituting each of the semiconductor chips 2, 3 is approximately 3 ppm, on the contrary a thermal expansion coefficient of the polyimide resin is large such as approximately 35 ppm. When the bonding projections do not exit, warps are easy to occur at the semiconductor chips 2, 3, and in particular, a warp amount tends to be large as thicknesses of the semiconductor chips 2, 3 become thin. Accordingly, there is a possibility in which the connection parts 6 of the bumps 4, 5 fracture by the warps of the semiconductor chips 2, 3 when the bumps 4, 5 are connected or after they are connected.

Figure 5:
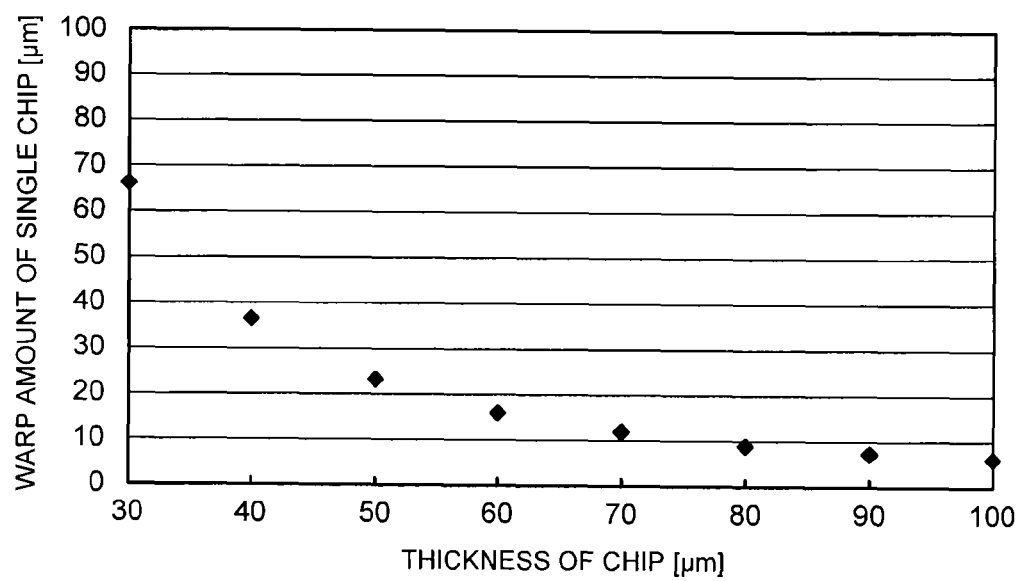
FIG. 5 is a view illustrating a relationship between a thickness of the semiconductor chip and a warp amount of a semiconductor chip.

An example of a relationship between the thickness of the semiconductor chip and the warp amount of the semiconductor chip at a room temperature is represented in FIG. 5. Here, the warp amount found by a simulation by a single semiconductor chip of which length of one edge is 12 mm is represented. As represented in FIG. 5, the warp amount becomes large as the thicknesses of the semiconductor chips 2, 3 become thinner. There is a possibility in which the bump connection parts 6 connecting the first bumps 4 and the second bumps 5 fracture if a large warp is generated at the semiconductor chips 2, 3. A failure occurrence rate when the thickness of each of the semiconductor chips 2, 3 is 100 μm is "0" (zero)%, the failure occurrence rate when the thickness is 90 μm is 10%, and the failure occurrence rate when the thickness is 80 μm is 30%. On the other hand, when the thickness of each of the semiconductor chips 2, 3 is 70 μm, the failure occurrence rate becomes approximately 100%.

To correspond to the above, the first semiconductor chip 2 and the second semiconductor chip 3 are connected by the bonding projections 8 in addition to the bump connection parts 6, and thereby, the connection strength between the first semiconductor chip 2 and the second semiconductor chip 3 is improved. Accordingly, it is possible to suppress the warps of the semiconductor chips 2, 3 after the bump connection by a thermocompression bonding or a reflowing (before the filling of the underfill resin 9). It becomes possible to suppress that the bump connection parts 6 of the first bumps 4 and the second bumps 5 fracture by the warps of the semiconductor chips 2, 3 before the filling of the underfill resin 9. It is thereby possible to suppress the occurrence of the connection failure (open failure).

The fracture of the bump connection part 6 caused by the warps of the semiconductor chips 2, 3 is easy to occur as the thicknesses of the semiconductor chips 2, 3 become thinner. The semiconductor device 1 of the embodiment is effective when the semiconductor chips 2, 3 having thicknesses of each 100 μm or less are used, and further, it is more effective when the semiconductor chips 2, 3 having thicknesses of each 70 μm or less are used. Further, it is effective when formation areas of the bumps 4, 5 are small. Accordingly, the semiconductor device 1 is effective when a rate of each of the formation areas of the bumps 4, 5 relative to the surfaces 2a, 3a of the semiconductor chips 2, 3 is 5% or less, and it is more effective when the rate is 1% or less.

The semiconductor device 1 is effective when the bumps 4, 5 having diameters of each 60 μm or less are used, further, it is more effective when the bumps 4, 5 having diameters of each 40 μm or less are used. The diameters of the bumps 4, 5 are each preferable to be 5 μm or more in consideration of a connection stability. Later-described semiconductor devices according to the other embodiments are the same. The diameter of the first bump 4 and the diameter of the second bump 5 may be approximately the same, or may be different. For example, when the second bump 5 is set to be a projecting shape, and the first bump 4 is set to be a pad shape, it is possible to increase a connectivity of the second bump 5 relative to the first bump 4 by making the diameter of the first bump 4 larger than that of the second bump 5.

Further, the bonding projections 8 are locally provided between the semiconductor chips 2, 3, and therefore, it is possible to increase alignment accuracy between the first semiconductor chip 2 and the second semiconductor chip 3, and the connectivity between the first bumps 4 and the second bumps 5. In a method in which a thermosetting insulating resin layer such a NCF (Non Conductive Film) having both a bonding function and a sealing function is disposed at the whole of a gap between the semiconductor chips, detection accuracy of alignment marks is lowered when first and second semiconductor chips are aligned. It is required to further increase the alignment accuracy as a formation pitch of micro-bumps becomes narrow. In the semiconductor device 1, the bonding projections 8 are locally provided without covering the alignment marks, and therefore, it is possible to increase the detection accuracy of the alignment marks, and thereby, it becomes possible to improve the alignment accuracy.

The thermosetting insulating resin layer disposed at the whole of the gap between the semiconductor chips is possible to be squeezed between first and second bumps, on the contrary, there is not a possibility that the locally provided bonding projections 8 deteriorates the connectivity between the bumps 4, 5. Accordingly, it is possible to improve the connectivity between the first bumps 4 and the second bumps 5. When the thermosetting insulating resin layer is disposed at the whole of the gap of the semiconductor chips, it is easy to generate voids at a connection time and a bonding time between the semiconductor chips. The voids generated at the connection region may cause a state in which a bump connection part is not covered with a resin to thereby generate a short circuit between the electrodes. In the semiconductor device 1, the bumps 4, 5 are connected while increasing the connection strength between the semiconductor chips 2, 3 by using the bonding projections 8, and the underfill resin 9 is filled. Accordingly, it is possible to seal under a state in which the bump connection parts 6 are surely covered. It is thereby possible to increase reliability of the semiconductor device 1.

Figure 2A:
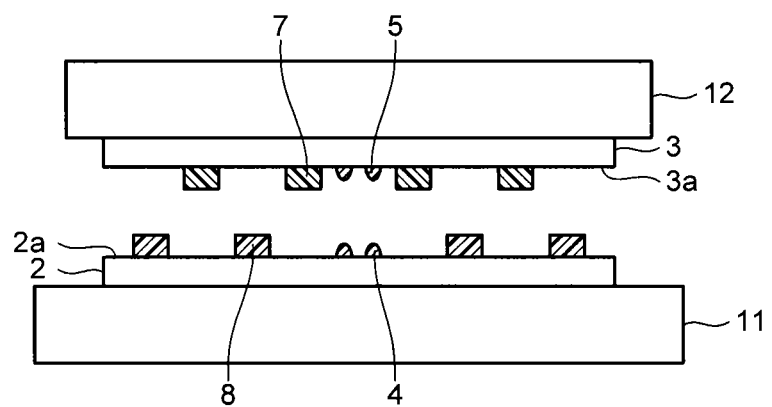
FIG. 2A to FIG. 2C are sectional views illustrating a first manufacturing process of the semiconductor device according to the first embodiment.

The above-stated semiconductor device 1 is, for example, manufactured as stated below. The manufacturing process of the semiconductor device 1 is described with reference to FIG. 2A to FIG. 2C, FIG. 3A and FIG. 3B and FIG. 4. As illustrated in FIG. 2A, the first semiconductor chip 2 including the first bumps 4 and the second semiconductor chip 3 including the second bumps 5 are prepared. In FIG. 2A, the stopper projections 7 are formed at the second non-connection region in the lower surface 3a of the second semiconductor chip 3. The bonding projections 8 are formed at the first non-connection region in the upper surface 2a of the first semiconductor chip 2. The stopper projections 7 and the bonding projections 8 may be formed at least one of the first and second non-connection regions. For example, they may be formed at both regions.

The stopper projection 7 is preferable to be formed by, for example, a polyimide resin, a phenol resin, an epoxy resin, a benzocyclobutene resin, and so on. The bonding projection 8 is preferable to be formed by, for example, a thermosetting resin such as the epoxy resin, the polyimide resin, an acrylic resin, and the phenol resin. The stopper projection 7 and the bonding projection 8 can be formed by applying a lithography technology, a coating technology using a dispensing technology, or by bonding a film. When the bonding projection 8 is formed of a resin by dispensing a thermosetting resin composition, it is preferable to make it in a half-cured state before the semiconductor chips 2, 3 are bonded. Otherwise, it is preferable to reduce times for bonding and connection of the semiconductor chips 2, 3 by using a fast curing type material.

Figure 3A:
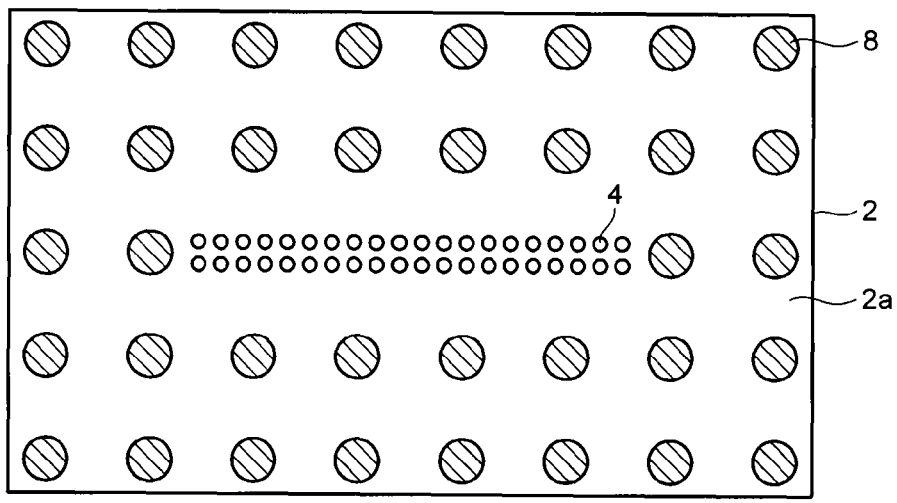
FIG. 3A and FIG. 3B are plan views illustrating a first example of bump formation surfaces of a first and a second semiconductor chip used for the manufacturing process of the first embodiment.
Figure 3B:
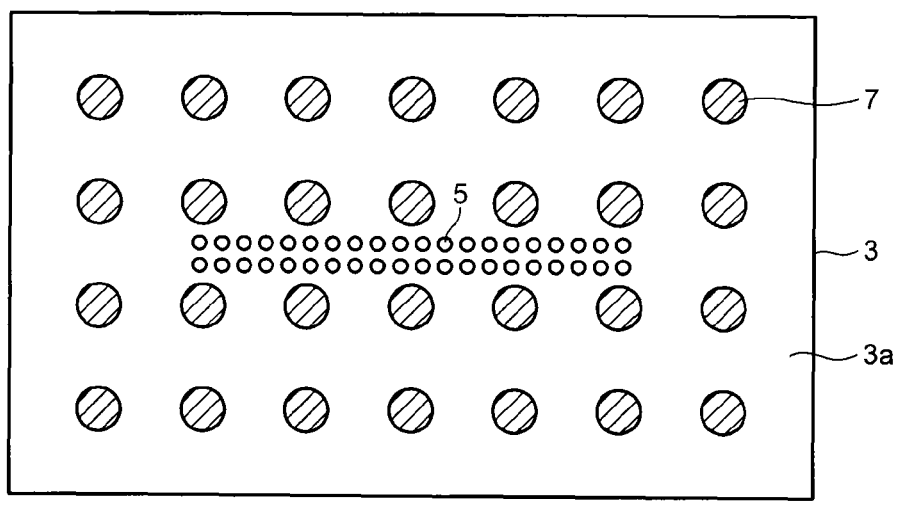
Figure 4:
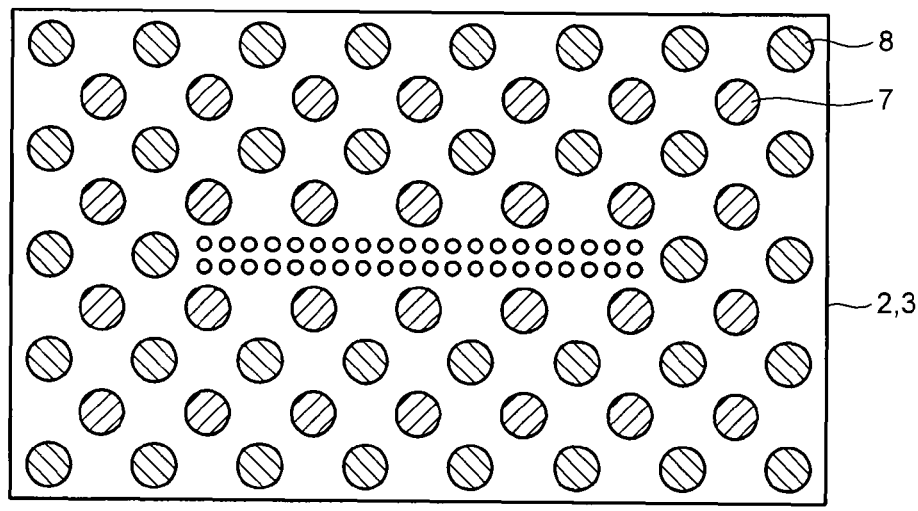
FIG. 4 is a plan perspective view illustrating a state in which the first semiconductor chip and the second semiconductor chip illustrated in FIG. 3A and FIG. 3B are combined.

Disposition examples of the stopper projections 7 and the bonding projections 8 are illustrated in FIG. 3A and FIG. 3B. FIG. 3A illustrates the upper surface (bump formation surface) 2a of the first semiconductor chip 2. FIG. 3B illustrates the lower surface (bump formation surface) 3a of the second semiconductor chip 3. The bumps 4, 5 are each disposed in vicinities of centers of the surfaces 2a, 3a of the semiconductor chips 2, 3, and the stopper projections 7 are disposed at a whole surface of the second semiconductor chip 3 including a periphery thereof. The bonding projections 8 are disposed among the stopper projections 7. FIG. 4 illustrates a disposition of the stopper projections 7 and the bonding projections 8 under a state in which the first semiconductor chip 2 and the second semiconductor chip 3 are combined.

Figure 6A:
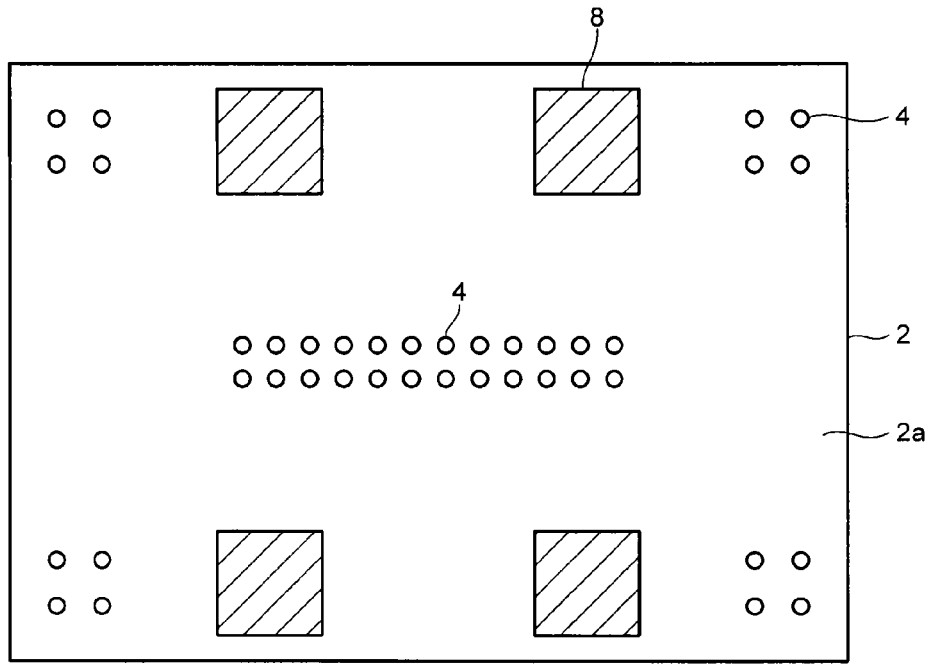
FIG. 6A and FIG. 6B are plan views illustrating a second example of the bump formation surfaces of the first and second semiconductor chips used for the manufacturing process of the first embodiment.
Figure 6B:
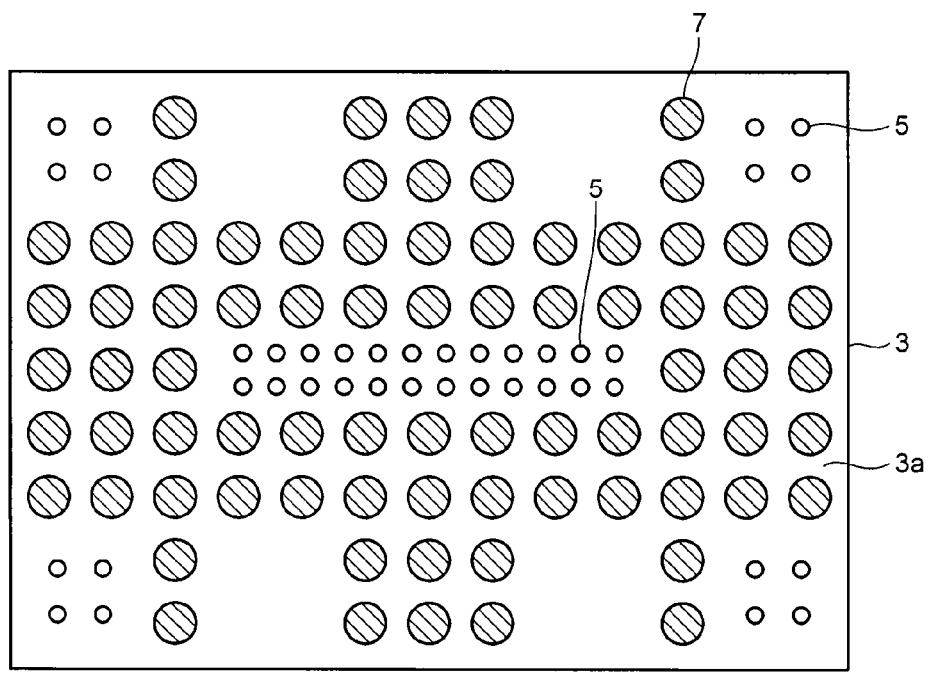
Figure 7:
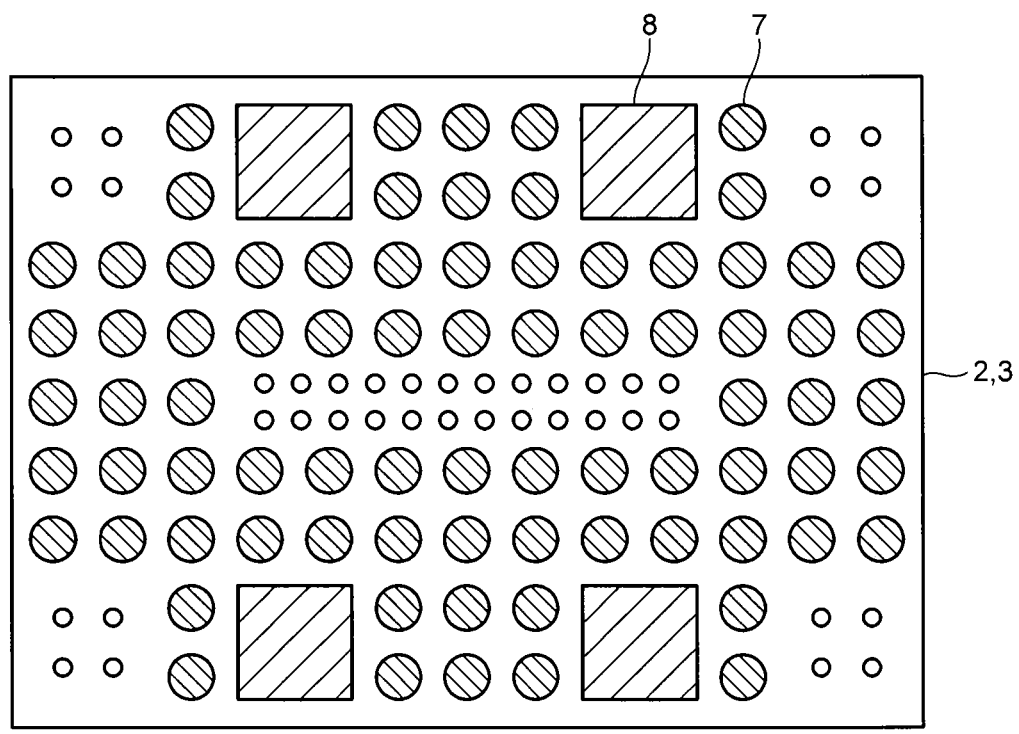
FIG. 7 is a plan perspective view illustrating a state in which the first semiconductor chip and the second semiconductor chip illustrated in FIG. 6A and FIG. 6B are combined.

FIG. 3A and FIG. 3B illustrate the stopper projection 7 of which diameter is approximately 20 μm to 1000 μm and the bonding projection 8 having a similar shape, but the size and shape of the stopper projection 7 and the bonding projection 8 are not limited thereto. When the bonding projection 8 is formed by dispensing the liquid resin and bonding the film, it is preferable that the bonding projection 8 has a certain level of area. As illustrated in FIG. 6B, the stopper projections 7 are not disposed at the whole surface of the second semiconductor chip 3, but a blank region (non-disposed region of the stopper projections 7) is formed at a part of the second semiconductor chip 3 when the stopper projections 7 are disposed. As illustrated in FIG. 6A, the bonding projections 8 are disposed at a region corresponding to the non-disposed region of the stopper projections 7. A disposition in which the stopper projections 7 and the bonding projections 8 are combined is illustrated in FIG. 7. The disposition as stated above is applied, and thereby, a formation property of the bonding projection 8 by dispensing the liquid resin or bonding film improves. FIG. 6A, FIG. 6B and FIG. 7 illustrate a structure in which the bumps 4, 5 are disposed also at four corners of the semiconductor chips 2, 3.

Figure 2B:
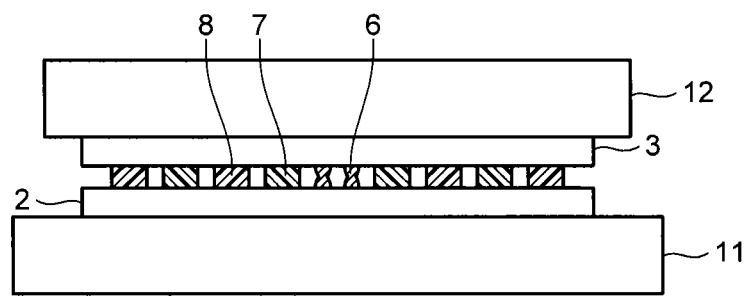

A first connecting method of the first and second semiconductor chips 2, 3 is described. As illustrated in FIG. 2A, the second semiconductor chip 3 held by a bonding head 12 is disposed above the first semiconductor chip 2 placed on a stage 11 and held by the stage 11. The alignment marks of the first and second semiconductor chips 2, 3 are detected by a not-illustrated camera, and the second semiconductor chip 3 is aligned to the first semiconductor chip 2. As illustrated in FIG. 2B, the first semiconductor chip 2 and the second semiconductor chip 3 are pressure-bonded at a temperature not less than a connection temperature of the bumps 4, 5 and not less than a temperature in which the thermosetting resin constituting the bonding projections 8 cure, while keeping a gap between the semiconductor chips 2, 3 by the stopper projections 7.

According to a thermocompression bonding process as stated above, the first bumps 4 and the second bumps 5 are connected, and the bonding projections 8 are bonded to the surfaces 2a, 3a of the first and second semiconductor chips 2, 3. For example, the connection temperature of the bumps 4, 5 is a temperature not less than a melting point of a solder when at least one of the bumps 4, 5 is formed by the solder. In the first connecting method, a process for curing the bonding projections 8 at a temperature not less than a temperature in which the thermosetting resin constituting the bonding projections 8 cure, and a process for pressure-bonding or reflowing the bumps 4, 5 at the temperature not less than the connection temperature of the bumps 4, 5 may be secondarily performed.

A second connecting method of the first and second semiconductor chips 2, 3 is described. In the same way as the first connecting method, the first semiconductor chip 2 and the second semiconductor chip 3 are aligned. In order to temporarily fix the first and second bumps 4, 5, the first semiconductor chip 2 and the second semiconductor chip 3 are pressure-bonded at a temperature less than the connection temperature of the bumps 4, 5 and not less than a temperature in which the thermosetting resin constituting the bonding projections 8 exhibit a bonding property and begin to cure. The bonding projections 8 are cured by heating at a temperature not less than the temperature in which the thermosetting resin constituting the bonding projections 8 cure. The first bumps 4 and the second bumps 5 are connected by pressure-bonding or reflowing at a temperature not less than the connection temperature of the bumps 4, 5.

In the second connecting method, by performing the temporarily fixing process of the bumps 4, 5 at a temperature and time not less than the temperature and time in which the thermosetting resin constituting the bonding projections 8 cure, the bonding projections 8 may be cured simultaneously with the temporarily fixing of the bumps 4, 5. Alternatively, by performing the connecting process at a temperature and time not less than the temperature and time in which the thermosetting resin constituting the bonding projections 8 cure, the bonding projections 8 may be cured simultaneously with the connecting of the bumps 4, 5. In these cases, the process for curing the bonding projections 8 may be cancelled.

Figure 2C:
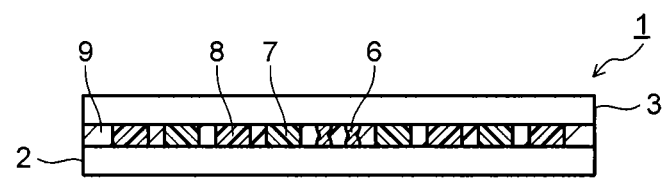

After connecting first semiconductor chip 2 and the second semiconductor chip 3 by the first or second connecting method, as illustrated in FIG. 2C, the underfill resin 9 is filled into the gap between the first semiconductor chip 2 and the second semiconductor chip 3 and cured, and thereby, the semiconductor device 1 is manufactured. It is not illustrated, but the semiconductor device 1 is used as a semiconductor device of a SiP structure and so on by being mounted on a circuit substrate such as a wiring board and a lead frame having external connection terminals. A connection between the semiconductor device 1 and the circuit substrate is enabled by a flip chip bonding, a wire bonding, and so on.

As stated above, the first semiconductor chip 2 and the second semiconductor chip 3 are connected by the bonding projections 8 in addition to the bump connection parts 6 at a previous stage of filling the underfill resin 9, and therefore, it is possible to suppress the warps of the semiconductor chips 2, 3 after the pressure-bonding or the reflowing. Accordingly, it is possible to suppress that the connection between the first bump 4 and the second bump 5 fractures before the underfill resin 9 is filled resulting from the warps of the semiconductor chips 2, 3. The occurrence of the connection failure (open failure) between the bumps 4, 5 is thereby suppressed.

Figure 8A:
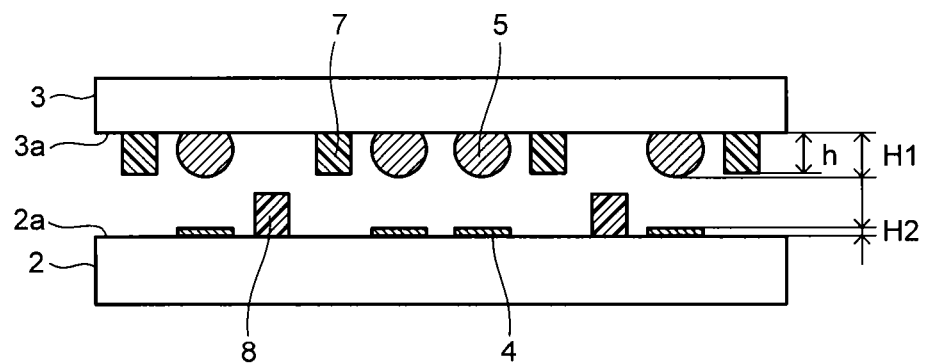
FIG. 8A to FIG. 8C are sectional views illustrating a second manufacturing process of the semiconductor device according to the first embodiment.
Figure 8B:
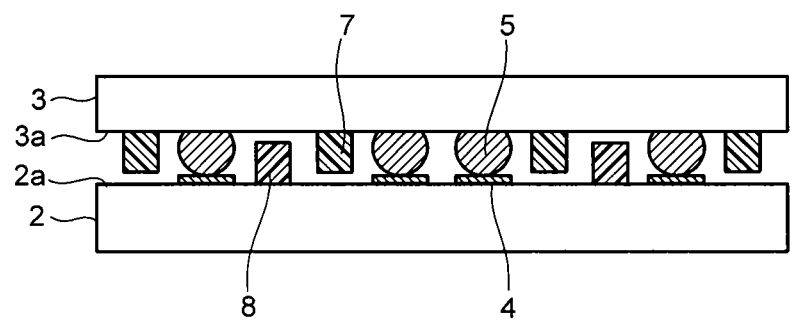
Figure 8C:
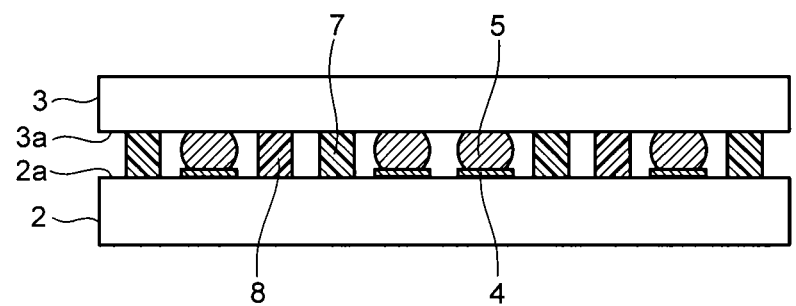

FIG. 8A to FIG. 8C illustrate a second manufacturing process of the semiconductor device 1. As illustrated in FIG. 8A, it is preferable that a height h of the stopper projection 7 is lower than a total height (H1+H2) of a height H1 of the first bump 4 and a height H2 of the second bump 5. The condition (h<H1+H2) as stated above is satisfied, and thereby, the first bumps 4 and the second bumps 5 are able to be connected more certainly. As illustrated in FIG. 8B, the second bumps 5 are in contact with the first bumps 4. At this stage, the stopper projections 7 are not in contact with the surface of the first semiconductor chip 2. As illustrated in FIG. 8C, for example, the second bumps 5 are deformed until the stopper projections 7 are in contact with the surface of the first semiconductor chip 2.

A process deforming the second bumps 5 may be a process in which the first bumps 4 and the second bumps 5 are pressure-bonded at the temperature in which the first bumps 4 and the second bumps 5 are connected, or a process in which the first bumps 4 and the second bumps 5 are temporality fixed at the temperature and time not less than the temperature and time in which the thermosetting resin constituting the bonding projection 8 exhibit a bonding property and begin to cure. Other processes are performed in the same way as the first manufacturing process of the semiconductor device 1. The condition (h<H1+H2) as stated above is satisfied, and thereby, it is prevented that the connection between the first bump 4 and the second bump 5 becomes insufficient (a contact state of the bumps 4, 5 becomes insufficient) because an gap kept by the stopper projections 7 becomes too wide.

Second Embodiment

Figure 9:
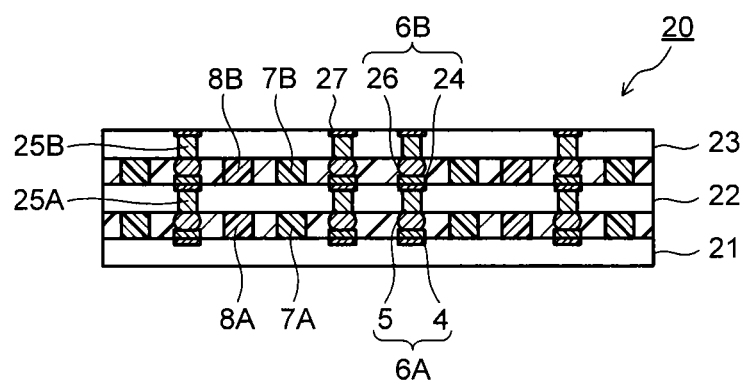
FIG. 9 is a sectional view illustrating a semiconductor device according to a second embodiment.

A semiconductor device according to a second embodiment is described. FIG. 9 is a view illustrating the semiconductor device according to the second embodiment. The same reference numerals are used for the same parts as the first embodiment, and there is a case when a part of descriptions is not given. A semiconductor device 20 illustrated in FIG. 9 has a structure in which a first semiconductor chip 21, a second semiconductor chip 22 and a third semiconductor chip 23 are stacked. Here, the semiconductor device 20 having the first to third semiconductor chips 21, 22, 23 is described, but the number of stacking of the semiconductor chips maybe four or more. In this case, a stacking process of the third semiconductor chip 23 is repeated, and thereby, a semiconductor device having the required number of semiconductor chips can be obtained.

An upper surface (first surface) of the first semiconductor chip 21 includes the first connection region, and the first bumps 4 are formed in the first connection region. A lower surface (second surface) of the second semiconductor chip 22 includes the second connection region, and the second bumps 5 are formed in the second connection region. The second semiconductor chip 22 is stacked on the first semiconductor chip 21 while connecting the second bumps 5 to the first bumps 4. The first semiconductor chip 21 and the second semiconductor chip 22 are electrically and mechanically connected via first bump connection parts 6A as same as the first embodiment.

The third semiconductor chip 23 is stacked on the second semiconductor chip 22, and therefore, an upper surface (third surface) of the second semiconductor chip 22 includes a third connection region, and third bumps 24 are formed in the third connection region. The second bumps 5 and the third bumps 24 are electrically connected via through electrodes (Through Silicon Via: TSV) 25A provided in the second semiconductor chip 22. A lower surface (fourth surface) of the third semiconductor chip 23 includes a fourth connection region, and fourth bumps 26 are formed in the fourth connection region. The second semiconductor chip 22 and the third semiconductor chip 23 are electrically and mechanically connected via second bump connection parts 6B. The fourth bumps 26 are electrically connected to electrodes 27 provided at an upper surface of the third semiconductor chip 23 via through electrodes (TSV) 25B.

First stopper projections 7A and first bonding projections 8A are each locally provided at least one region of the first non-connection region in the upper surface of the first semiconductor chip 21 and the second non-connection region in the lower surface of the second semiconductor chip 22. Tips of the stopper projections 7A are in contact with the other region of the first and second non-connection regions in an unbonded state. The bonding projections 8A provided at least one region of the first and second non-connection regions are bonded to the other region of the first and second non-connection regions. The bonding projections 8A are locally provided between the first non-connection region and the second non-connection region, and each bonded to the upper surface of the first semiconductor chip 21 and the lower surface of the second semiconductor chip 22.

Similarly, second stopper projections 7B and second bonding projections 8B are each locally provided at least one region of a third non-connection region in the upper surface of the second semiconductor chip 22 and a fourth non-connection region in the lower surface of the third semiconductor chip 23. Tips of the stopper projections 7B are in contact with the other region of the third and fourth con-connection regions in an unbonded state. The bonding projections 8B provided at least one region of the third and fourth non-connection regions are bonded to the other region of the third and fourth non-connection regions. The bonding projections 8B are locally provided between the third non-connection region and the fourth non-connection region, and each bonded to the upper surface of the second semiconductor chip 22 and the lower surface of the third semiconductor chip 23.

When the three or more semiconductor chips are stacked, by increasing the connection strength between the semiconductor chips before the filling of the underfill resin 9 by the bonding projections 8A, 8B, it is possible to suppress the warps of the semiconductor chips after the thermocompression bonding or the reflowing. Accordingly, it becomes possible to suppress the connection failure (open failure) between the first and second bumps 4, 5 and between the third and fourth bumps 24, 26. The formation materials, the formation positions, the disposition shapes, and so on of the stopper projections 7A, 7B, and the bonding projections 8A, 8B are the same as the first embodiment.

Figure 10:
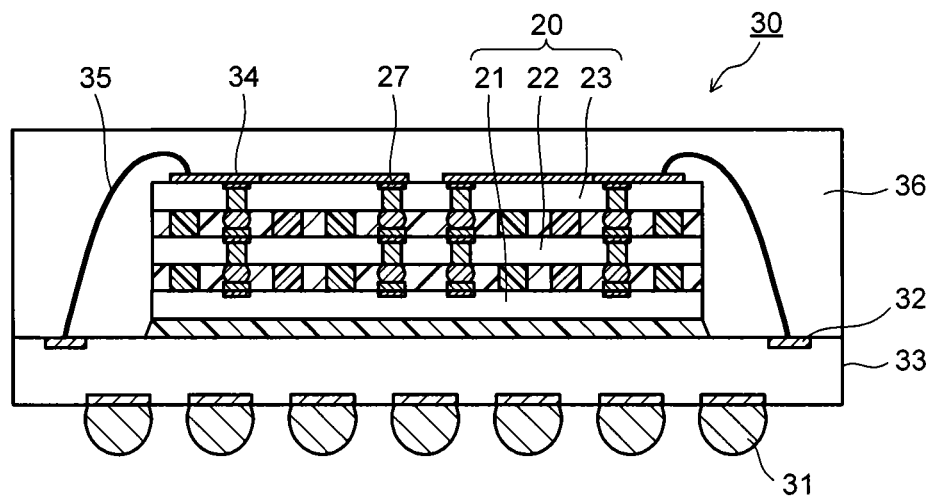
FIG. 10 is a sectional view illustrating a semiconductor package using the semiconductor device illustrated in FIG. 9.

The semiconductor device 20 according to the second embodiment is used as, for example, a semiconductor package 30 as illustrated in FIG. 10. In the semiconductor package 30 illustrated in FIG. 10, the semiconductor device 20 is mounted on a wiring substrate 33 including external connection terminals 31 and internal connection terminals 32. The internal connection terminals 32 are electrically connected to the semiconductor device 20 via a rewiring layer 34 formed at an upper surface of the semiconductor chip 23 at an uppermost stage of the semiconductor device 20 and bonding wires 35. A resin sealing layer 36 sealing the semiconductor device 20 together with the bonding wires 35 and so on is formed on the wiring substrate 33.

Figure 11:
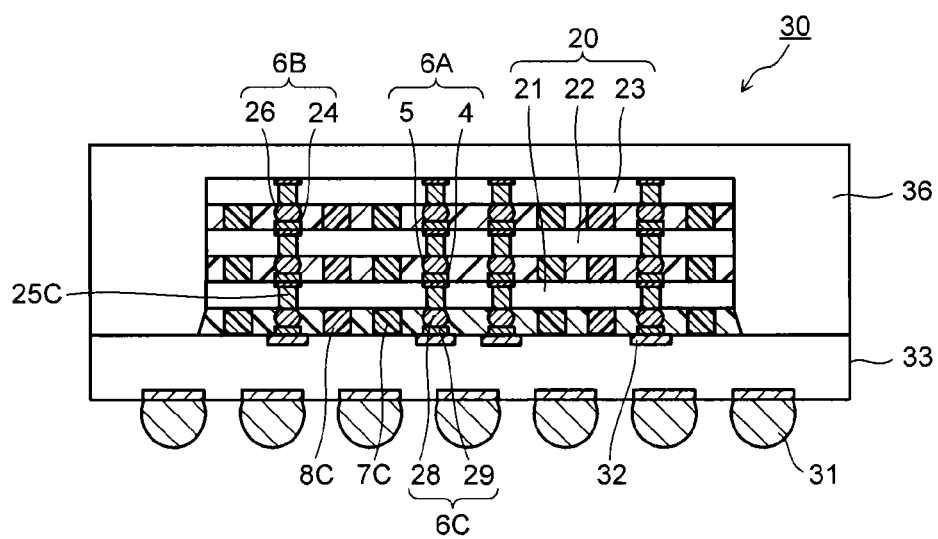
FIG. 11 is a sectional view illustrating a first modification example of the semiconductor package illustrated in FIG. 10.

The electrical connection between the semiconductor device 20 and the wiring substrate 33 may be performed by the flip chip bonding. FIG. 11 illustrates a state in which the semiconductor device 20 and the wiring substrate 33 are flip chip bonded. Fifth bumps 28 are provided at a lower surface of the first semiconductor chip 21 to perform the flip chip bonding of the semiconductor device 20. The fifth bumps 28 and the first bumps 4 are electrically connected via through electrodes (TSV) 25C provided in the first semiconductor chip 21. The first semiconductor chip 21 is mounted on the substrate 33. The substrate 33 and the first semiconductor chip 21 are electrically and mechanically connected via connection bodies (bump connection parts) 6C of sixth bumps 29 provided on the internal connection terminals 32 of the substrate 33 and the fifth bumps 28.

Third stopper projections 7C and third bonding projections 8C are each locally provided at least one region of a non-connection region in the lower surface of the first semiconductor chip 21 and a surface of the substrate 33. Tips of the stopper projections 7C are in contact with the other region of the non-connection region in the lower surface of the first semiconductor chip 21 and the surface of the substrate 33 in an unbonded state. The bonding projections 8C provided at least one region of the non-connection region in the lower surface of the first semiconductor chip 21 and the surface of the surface 33 are bonded to the other region of the non-connection region in the lower surface of the first semiconductor chip 21 and the surface of the substrate 33.

Figure 12:
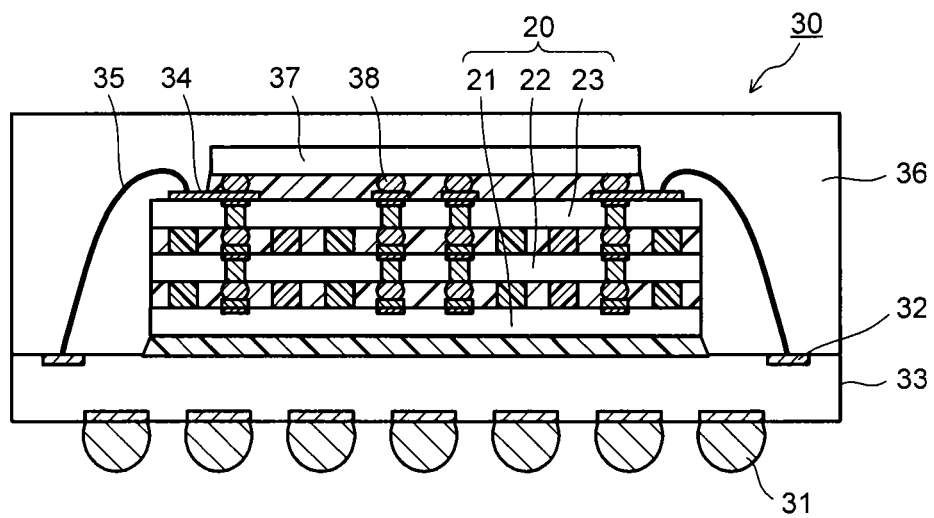
FIG. 12 is a sectional view illustrating a second modification example of the semiconductor package illustrated in FIG. 10.
Figure 13:
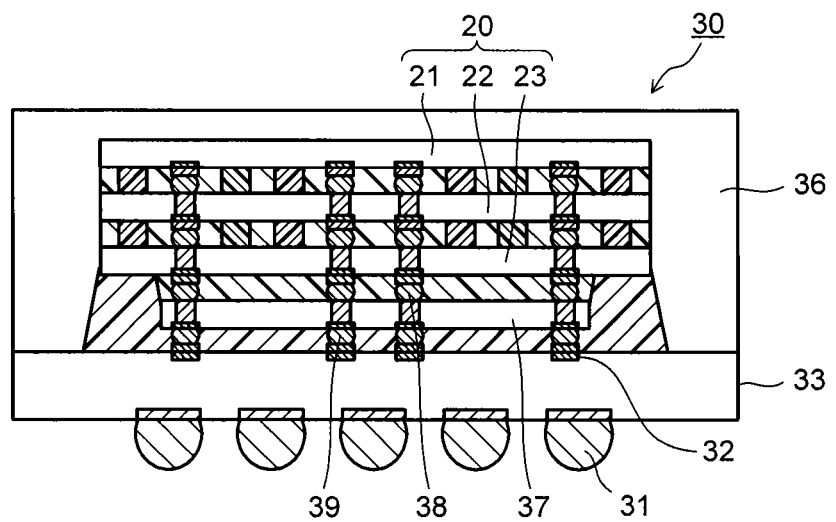
FIG. 13 is a sectional view illustrating a third modification example of the semiconductor package illustrated in FIG. 10.

FIG. 12 illustrates a modification example of the semiconductor package 30. When the semiconductor chips 21 to 23 constituting the semiconductor device 20 are each a memory chip such as an NAND type flash memory, a semiconductor chip 37 performing a data communication between external devices such as a controller chip and an interface chip may be mounted on the semiconductor device 20. The semiconductor chip 37 is connected to the semiconductor device 20 via solder bumps 38. The semiconductor device 20 is connected to the wiring substrate 33 via the semiconductor chip 37, the bonding wires 35, and so on. As illustrated in FIG. 13, the semiconductor device 20 may be electrically and mechanically connected to the wiring substrate 33 via solder bumps 39 provided at the semiconductor chip 37 positioning at the uppermost stage in a stacking order (the lowermost stage in the drawing) of the semiconductor device 20.

A manufacturing process of the semiconductor device 20 according to the second embodiment is described with reference to FIG. 14A to FIG. 14F. In FIG. 14A to FIG. 14F, the stage 11 and the bonding head 12 are not illustrated, but the stacking process is basically performed as same as the first embodiment.

Figure 14A:
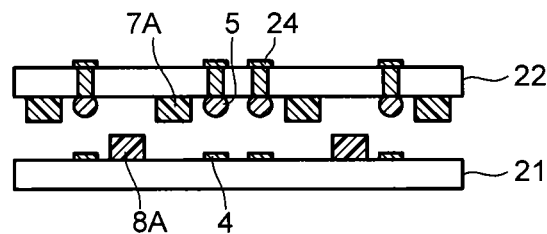
FIG. 14A to FIG. 14F are sectional views illustrating a manufacturing process of the semiconductor device according to the second embodiment.
Figure 14B:
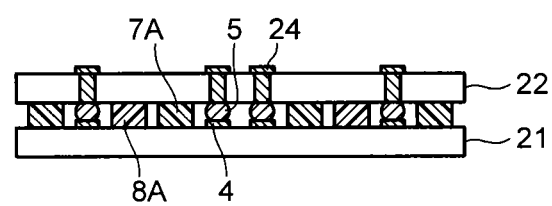

A first connecting method of the first, second and third semiconductor chips 21, 22, 23 is described. As illustrated in FIG. 14A, the first semiconductor chip 21 including the first bumps 4 and the first bonding projections 8A and the second semiconductor chip 22 including the second bumps 5 and the first stopper projections 7A are aligned. As illustrated in FIG. 14B, the first bumps 4 and the second bumps 5 are connected by pressure-bonding the first and second semiconductor chips 21, 22 at a temperature not less than a connection temperature of the bumps 4, 5 and not less than a temperature in which the thermosetting resin constituting the bonding projections 8A cure.

Figure 14C:
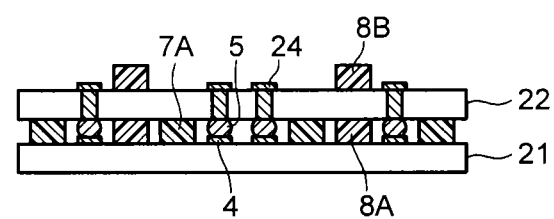
Figure 14D:
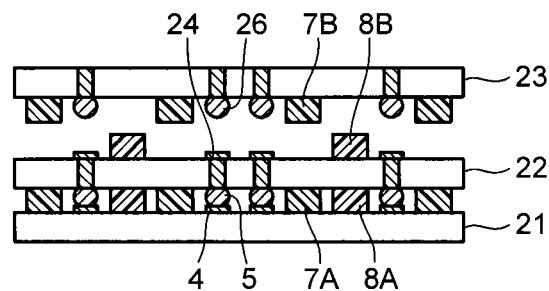
Figure 14E:
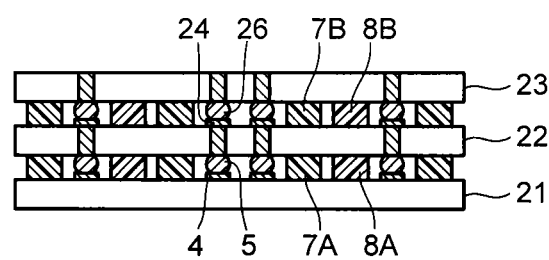

As illustrated in FIG. 14C, the second bonding projections 8B are formed at the third non-connection region in the upper surface of the second semiconductor chip 22. The second bonding projections 8B are preferable to be formed by, for example, dispensing the resin, bonding the film, or the like. As illustrated in FIG. 14D, the third semiconductor chip 23 including the fourth bumps 26 and the second stopper projections 7B is aligned to the second semiconductor chip 22. As illustrated in FIG. 14E, the third bumps 24 and the forth bumps 26 are connected by pressure-bonding the second and third semiconductor chips 22, 23 at the temperature not less than the connection temperature of the bumps 24, 26 and not less than the temperature in which the thermosetting resin constituting the bonding projections 8B cure.

In the first connecting method, a process for curing the bonding projections 8A, 8B at the temperature and time not less than the temperature and time in which the thermosetting resin constituting the bonding projections 8 cure, and a process for pressure-bonding or reflowing the bumps 4, 5, 24, 26 at the temperature not less than the connection temperature of the bumps 4, 5, 24, 26 may be secondarily performed.

A second connecting method of the first, second and third semiconductor chips 21, 22, 23 is described. The first semiconductor chip 21 including the first bumps 4 and the first bonding projections 8A and the second semiconductor chip 22 including the second bumps 5 and the first stopper projections 7A are aligned. The first and second bumps 4, 5 are temporarily fixed at a temperature and time not less than the temperature and time in which the thermosetting resin constituting the bonding projections 8A exhibit the bonding property and begin to cure.

The second bonding projections 8B are formed at the third non-connection region in the upper surface of the second semiconductor chip 22. The third semiconductor chip 23 including the fourth bumps 26 and the second stopper projections 7B is aligned to the second semiconductor chip 22. The third bumps 24 and the fourth bumps 26 are temporarily fixed at the temperature and time not less than the temperature and time in which the thermosetting resin constituting the bonding projections 8B exhibit the bonding property and begin to cure.

A stacked body of the first to third semiconductor chips 21, 22, 23 is disposed in an oven, and is heated at the temperature and time not less than the temperature and time in which the thermosetting resin constituting the bonding projections 8A, 8B cure. By curing the bonding projections 8A, 8B, the first semiconductor chip 21 and the second semiconductor chip 22 are bonded by the bonding projections 8A, and the second semiconductor chip 22 and the third semiconductor chip 23 are bonded by the bonding projections 8B. The chip stacked body in which the semiconductor chips 21, 22, 23 are bonded by the bonding projections 8A, 8B, is pressure-bonded or reflowed at the temperature not less than the connection temperature of the bumps 4, 5, 24, 26.

The pressure-bonding process is performed by pressure-bonding while heating the chip stacked body in which the bonding projections 8A, 8B are cured. When the reflow process is applied, the chips stacked body in which the semiconductor chips are bonded by the bonding projections 8A, 8B is disposed in a ref low furnace. Inside the reflow furnace is heated to the temperature not less than the temperature of the connection temperature of the bumps under a state of a reducing atmosphere, and thereby, the first bumps 4 and the second bumps 5 are connected, and the third bumps 24 and the fourth bumps 26 are connected. The reflow process is preferable to be performed in the reducing atmosphere. It is thereby possible to obtain the bump connection part while removing a surface oxide film of the bumps.

In the second connecting method, the curing process of the bonding projections 8A, 8B may be simultaneously performed with the temporarily fixing of the bumps. In this case, the temporarily fixing of the bumps is performed at the temperature and time not less than the temperature and time in which the thermosetting resin constituting the bonding projections 8A, 8B cure. Alternatively, the curing process of the bonding projections 8A, 8B may be simultaneously performed with the connecting of the bumps. In this case, the connecting of the bumps is performed at the temperature and time not less than the temperature in which the thermosetting resin constituting the bonding projections 8A, 8B cure. If a curing reaction of the bonding projections 8A, 8B is insufficient, there is a possibility in which peeling occurs resulting from the insufficient bonding between the bonding projections 8A, 8B and the semiconductor chips 21, 22, 23 and the bump connection parts 6 fracture to thereby cause the connection failure. Accordingly, it is preferable that the bonding projections 8A, 8B are enough cured within a range capable of maintaining the bonding property.

A third connecting method of the first, second and third semiconductor chips 21, 22, 23 is described. In the same way as the second connecting method, the first bumps 4 and the second bumps 5 are temporarily fixed. The second bonding projections 8B are formed at the third non-connection region in the upper surface of the second semiconductor chip 22. The third semiconductor chip 23 including the fourth bumps 26 and the second stopper projections 7B is aligned to the second semiconductor chip 22. The third bumps 24 and the forth bumps 26 are connected by pressure-bonding the second and third semiconductor chips 22, 23 at the temperature not less than the connection temperature of the bumps 24, 26 and not less than the temperature in which the thermosetting resin constituting the bonding projections 8B cure.

Thus, the uppermost semiconductor chip 23 is preferable to be pressure-bonded while being heated to the temperature of the connection temperature of the bumps or more. The other semiconductor chips 21, 22 are pressure-bonded while being heated to the temperature less than the connection temperature of the bumps. The strength of the chip stacked body is thereby improved. When all of the semiconductor chips 21, 22, 23 are pressure-bonded at the temperature of the connection temperature of the bumps or more, a heat load for the semiconductor chips 21, 22, 23 increases. It is possible to reduce the heat load for the semiconductor chips 21, 22, 23 and to increase the strength of the chip stacked body by pressure-bonding while heating only the uppermost semiconductor chip 23 to the temperature of the connection temperature of the bumps or more.

The uppermost semiconductor chip 23 is thermocompression bonded at the temperature of the connection temperature of the bumps or more. The first bumps 4 and the second bumps 5 are connected, and the third bumps 24 and the fourth bumps 26 are connected. In the third connecting method, the curing process of the bonding projections 8A, 8B, and the pressure-bonding or ref lowing process of the chip stacked body may be secondarily performed. As the semiconductor package illustrated in FIG. 12, when size of the first to third semiconductor chips 21, 22, 23 and the uppermost semiconductor chip 37 are different and when arranges of the bumps are different, it is preferable that each of the third semiconductor chip 23 and the uppermost semiconductor chip 37 is pressure-bonded while being heated to the temperature of the connection temperature of the bumps or more. The other semiconductor chips 21, 22 are pressure-bonded while being heated to the temperature less than the connection temperature of the bumps.

Figure 14F:
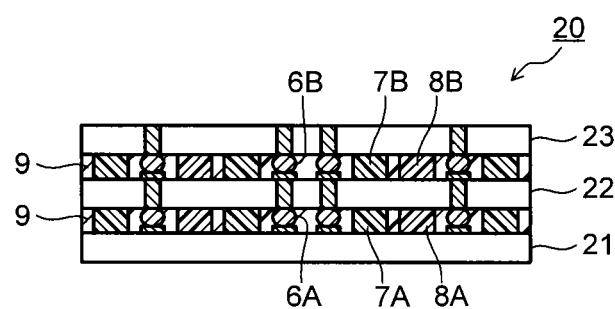

After connecting first to third semiconductor chips 21, 22, 23 by the first, second or third connecting method, as illustrated in FIG. 14F, the underfill resin 9 is filled into each of the gap between the first semiconductor chip 21 and the second semiconductor chip 22, and the gap between the second semiconductor chip 22 and the third semiconductor chip 23 and cured. The semiconductor device 20 according to the second embodiment is thereby manufactured. It is also possible to suppress the warps of the semiconductor chips after the thermocompression bonding or the ref lowing by increasing the connection strength between the semiconductor chips before the underfill resin 9 is filled by the bonding projections 8A, 8B even when three or more pieces of semiconductor chips are stacked. Accordingly, it becomes possible to suppress the connection failures (open failures) between the first and second bumps 4, 5 and the third and fourth bumps 24, 26.

Third Embodiment

A configuration and a manufacturing process of a semiconductor device according to a third embodiment are described with reference to FIG. 15 and FIG. 16A to FIG. 16C. A semiconductor device 40 according to the third embodiment includes stopper and bonding projections 41 instead of the stopper projections 7 and the bonding projections 8 according to the first and second embodiments. The same reference numerals are used for the same parts as the first and second embodiments, and there is a case when a part of the description is not given.

Figure 15:
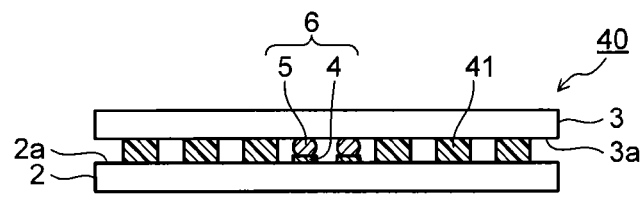
FIG. 15 is a sectional view illustrating a semiconductor device according to a third embodiment.

The semiconductor device 40 illustrated in FIG. 15 includes the first semiconductor chip 2 having the stopper and bonding projections 41 and the first bumps 4, and the second semiconductor chip 3 having the second bumps 5. The first semiconductor chip 2 and the second semiconductor chip 3 are electrically and mechanically connected via connection bodies (bump connection parts 6) of the first bumps 4 and the second bumps 5. The stopper and bonding projections 41 are locally provided at the non-connection region in the upper surface (first surface) 2a of the first semiconductor chip 2, and they are each bonded to the upper surface 2a of the first semiconductor chip 2 and the lower surface 3a of the second semiconductor chip 3. The underfill resin 9 is filled into the gap between the first semiconductor chip 2 and the second semiconductor chip 3.

The stopper and bonding projections 41 provided at the upper surface 2a of the first semiconductor chip 2 keep the gap between the first semiconductor chip 2 and the second semiconductor chip 3 when they are pressure-bonded, and the stopper and bonding projections 41 are bonded to the lower surface 3a of the second semiconductor chip 3 when they are heated. Accordingly, it is possible to increase the connection strength between the first semiconductor chip 2 and the second semiconductor chip 3 before the underfill resin 9 is filled while keeping the gap between the first semiconductor chip 2 and the second semiconductor chip 3 at the pressure-bonding time as same as the first embodiment using the stopper projections 7 and the bonding projections 8. It is thereby possible to improve connection reliability between the bumps 4, 5.

The stopper and bonding projection 41 is formed by using, for example, a resin having a photosensitivity and a thermosetting property. A thermosetting resin containing photosensitive agent such as a photosensitive adhesive resin can be cited as concrete examples of the photosensitive and thermosetting resin. According to the photosensitive and thermosetting resin, they are cured by irradiation of ultraviolet light and so on, and therefore, it is possible to make them function as a stopper at the formation stage of the projections 41. Further, they are cured at the heating time, and therefore, they are firmly bonded to the surfaces of the first and second semiconductor chips 2, 3, and function as the bonding agent (bonding projection). The stopper and bonding projection 41 may be the one in which, for example, a bonding layer is formed at a tip of a heat-resistant resin projection without being limited to the one formed by the resin having the photosensitivity and the thermosetting property. The similar stopper function and the bonding function can be obtained by the above. The stopper and bonding projections 41 may be provided at the lower surface 3a of the second semiconductor chip 3.

Figure 16A:
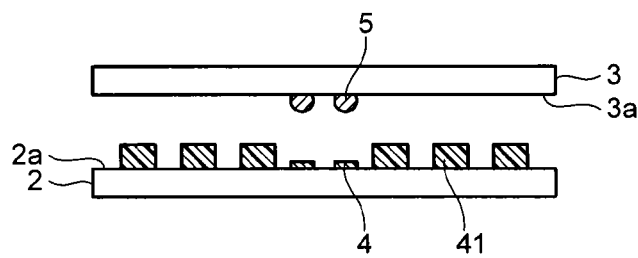
FIG. 16A to FIG. 16C are sectional views illustrating a manufacturing process of the semiconductor device according to the third embodiment.
Figure 17A:
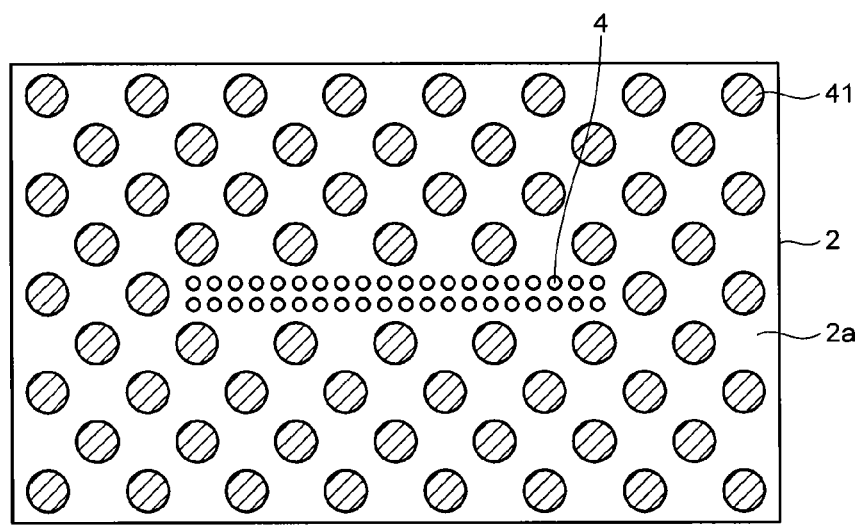
FIG. 17A and FIG. 17B are plan views illustrating bump formation surfaces of a first and a second semiconductor chip used for the manufacturing process of the third embodiment.
Figure 17B:
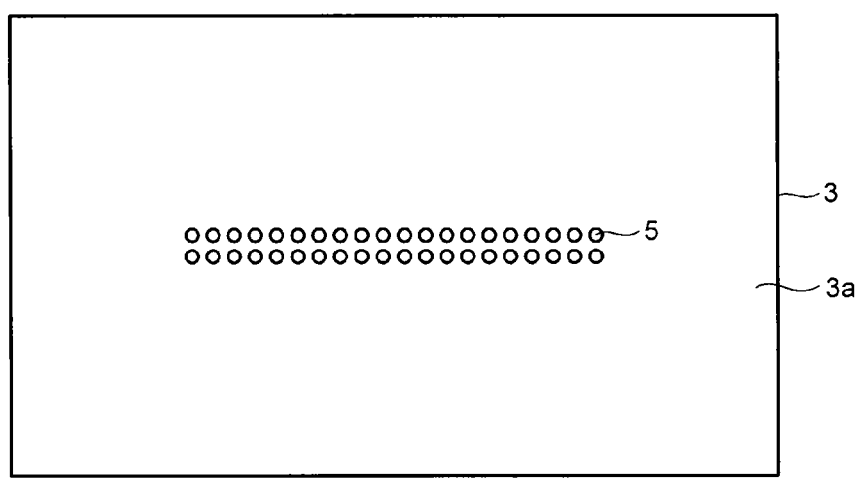
Figure 18:
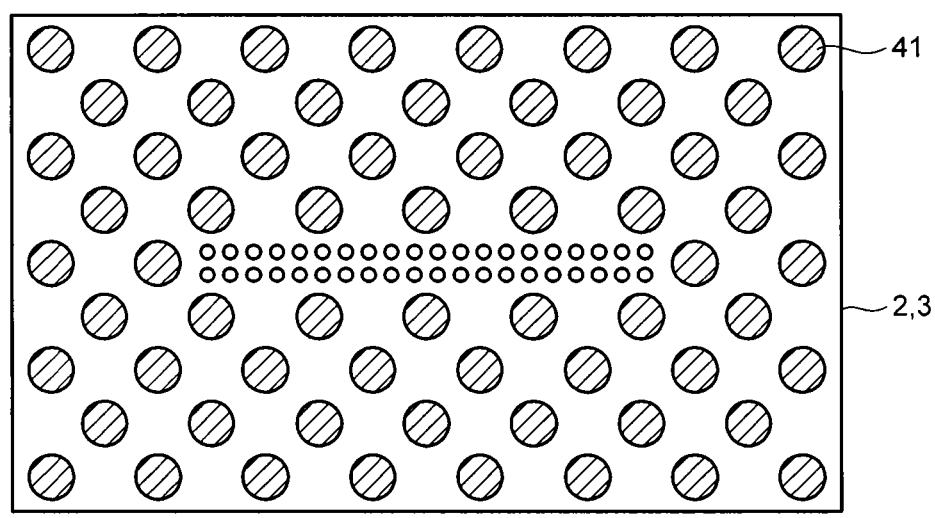
FIG. 18 is a plan perspective view illustrating a state in which the first semiconductor chip and the second semiconductor chip illustrated in FIG. 17A and FIG. 17B are combined.

The semiconductor device 40 according to the third embodiment is manufactured as stated below. As illustrated in FIG. 16A, the first semiconductor chip 2 including the first bumps 4 and the stopper and bonding projections 41, and the second semiconductor chip 3 including the second bumps 5 are prepared. A disposition example of the stopper and bonding projections 41 is illustrated in FIG. 17A, FIG. 17B and FIG. 18. FIG. 17A illustrates the upper surface (electrode formation surface) 2a of the first semiconductor chip 2. FIG. 17B illustrates the lower surface (electrode formation surface) 3a of the second semiconductor chip 3. FIG. 18 illustrates a state in which the first semiconductor chip 2 and the second semiconductor chip 3 are combined. The stopper and bonding projections 41 are disposed at a whole surface of the first semiconductor chip 2 including a periphery of the bumps 4 existing in a vicinity of a center of the semiconductor chip 2.

Figure 16B:
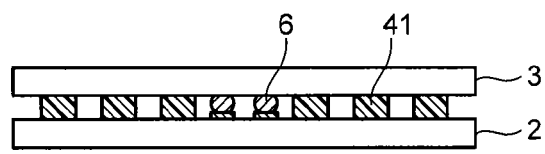

The first semiconductor chip 2 and the second semiconductor chip 3 are aligned as same as the first embodiment. As illustrated in FIG. 16B, the first semiconductor chip 2 and the second semiconductor chip 3 are pressure-bonded and heated while keeping the gap by the stopper and bonding projections 41. The first bumps 4 and the second bumps 5 are connected and the stopper and bonding projections 41 are bonded to the surfaces 2a, 3a of the first and second semiconductor chips 2, 3 by the thermocompression bonding process as stated above. The process for connecting the first semiconductor chip 2 and the second semiconductor chip 3 is performed as same as the first or second connecting method in the first embodiment.

Figure 16C:
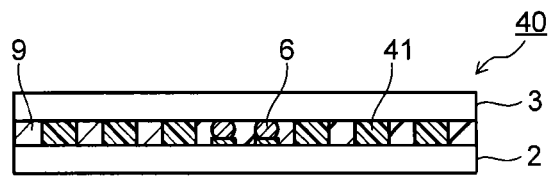

The underfill resin 9 is filled into the gap between the first semiconductor chip 2 and the second semiconductor chip 3 and cured as illustrated in FIG. 16C, and thereby, the semiconductor device 40 is manufactured. The first semiconductor chip 2 and the second semiconductor chip 3 are connected by the stopper and bonding projections 41 in addition to the bump connection parts 6 at the stage before the underfill resin 9 is filled, and therefore, the warp of the semiconductor chips 2, 3 after the thermocompression bonding or the reflow can be suppressed. Accordingly, it becomes possible to suppress the occurrence of the connection failure (open failure) resulting from the fracture of the connection between the first bump 4 and the second bump 5 before the underfill resin 9 is filled caused by the warps of the semiconductor chips 2, 3.

Figure 19:
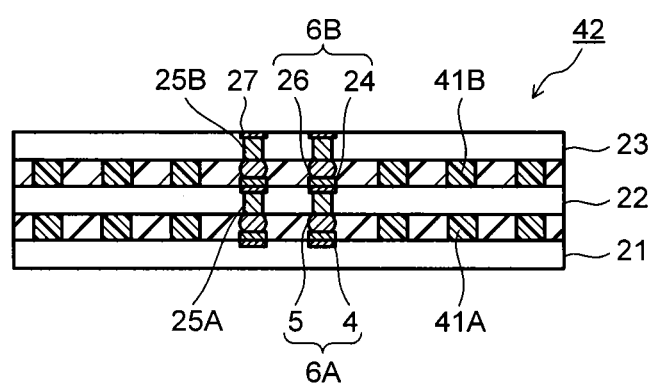
FIG. 19 is a sectional view illustrating another example of the semiconductor device according to the third embodiment.

When three or more semiconductor chips are stacked, the stacking process of the semiconductor chip is to be performed repeatedly. FIG. 19 illustrates a semiconductor device 42 constituted by stacking three semiconductor chips 21, 22, 23. The semiconductor device 42 as stated above is manufactured by applying a connecting method as same as the first, second or third connecting method in the second embodiment. The first to third semiconductor chips 21, 22, 23 are connected as same as the first, second or third connecting method in the second embodiment. The stopper and bonding projections 41 is preferable to be formed at a lower surface of the semiconductor chips (22, 23) in the upper side. The underfill resin 9 is filled into each of the gap between the first semiconductor chip 21 and the second semiconductor chip 22 and the gap between the second semiconductor chip 22 and the third semiconductor chip 23 and cured.

Fourth Embodiment

A configuration of a semiconductor device according to a fourth embodiment is described with reference to FIG. 20A, FIG. 20B, FIG. 21, FIG. 22A, FIG. 22B and FIG. 23. The semiconductor device according to the fourth embodiment is the one in which a fillet suppression function of the underfill resin is added to the bonding projection 8 in the first and second embodiments or the stopper and bonding projection 41 in the third embodiment. Note that the other configurations are the same as the first to third embodiments, and the description is not given here.

Figure 20A:
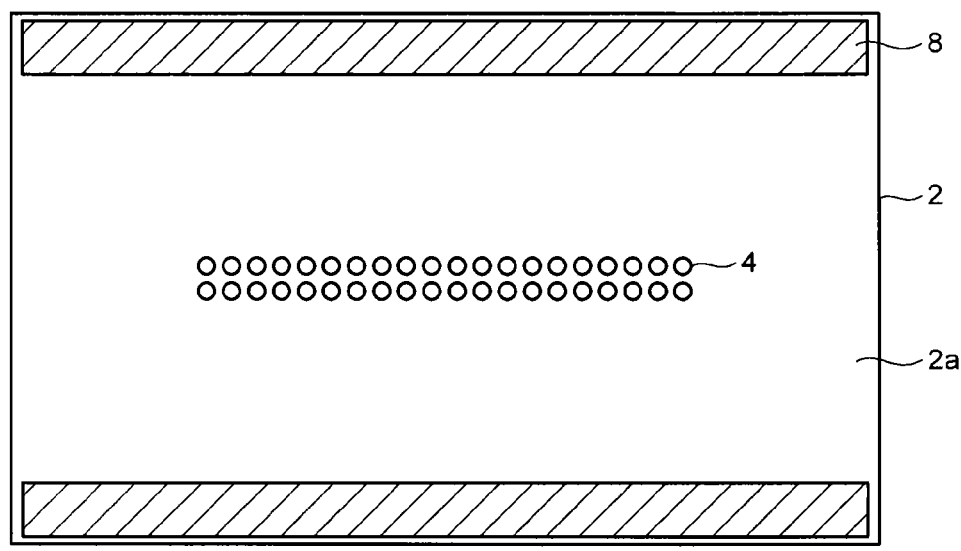
FIG. 20A and FIG. 20B are plan views illustrating a first example of bump formation surfaces of a first and a second semiconductor chip used for a manufacturing process of a fourth embodiment.
Figure 20B:
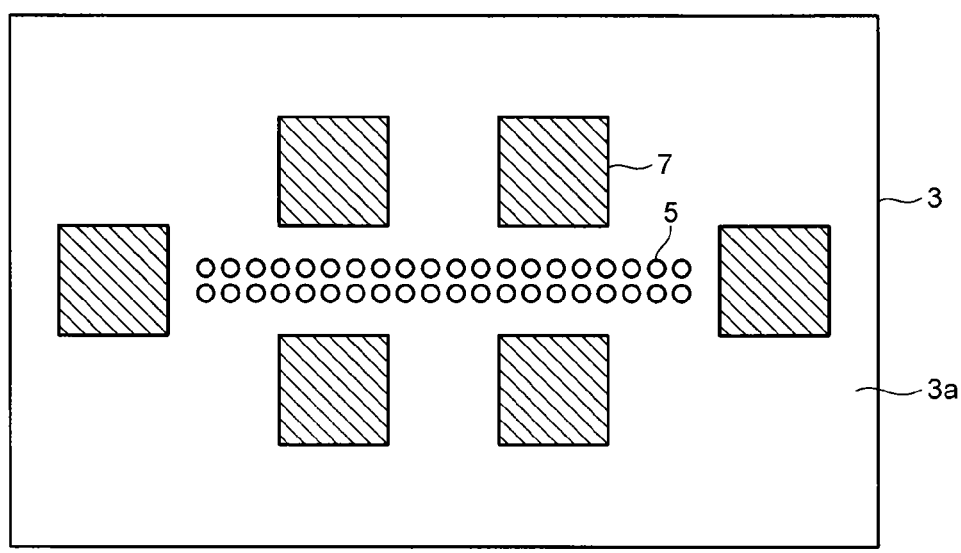
Figure 21:
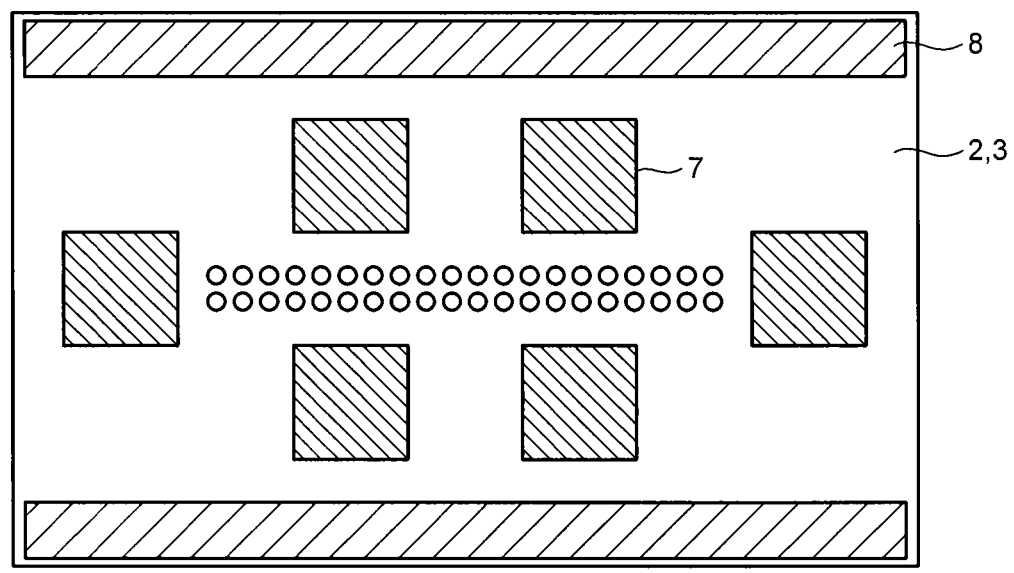
FIG. 21 is a plan perspective view illustrating a state in which the first semiconductor chip and the second semiconductor chip illustrated in FIG. 20A and FIG. 20B are combined.

FIG. 20A and FIG. 20B illustrate a disposition example of the bonding projections 8 having the side drop suppression function of the underfill resin. FIG. 20A illustrates the upper surface 2a of the first semiconductor chip 2. FIG. 20B illustrates the lower surface 3a of the second semiconductor chip 3. FIG. 21 illustrates a state in which the first semiconductor chip 2 and the second semiconductor chip 3 are combined. The bonding projections 8 are provided at outer peripheral regions of the semiconductor chip 2 along facing two outer edges of the semiconductor chip 2. According to the bonding projections 8 as stated above, it is possible to suppress the side drop of the underfill resin from other than an injection edge of the underfill resin and a facing edge.

Figure 22A:
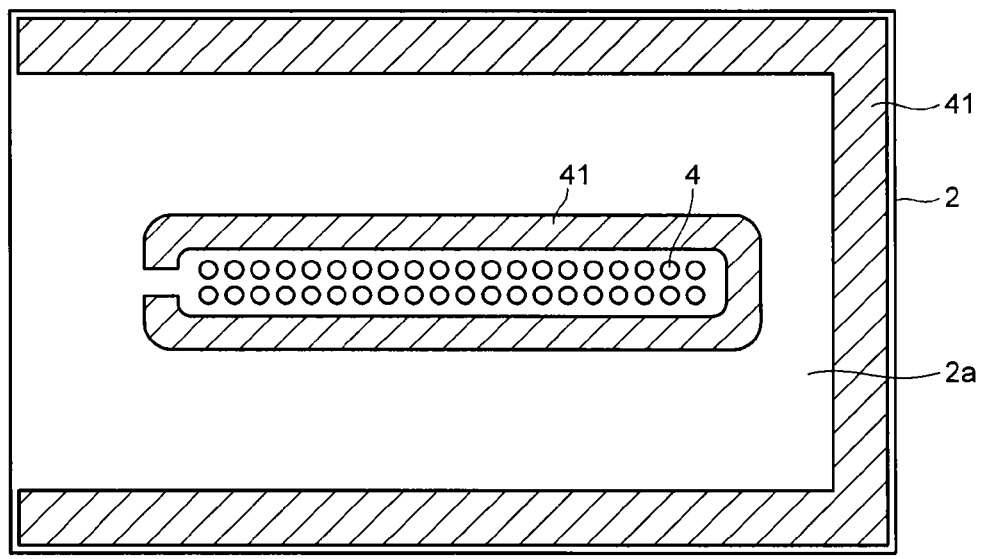
FIG. 22A and FIG. 22B are plan views illustrating a second example of bump formation surfaces of a first and a second semiconductor chip used for a manufacturing process of the fourth embodiment.
Figure 22B:
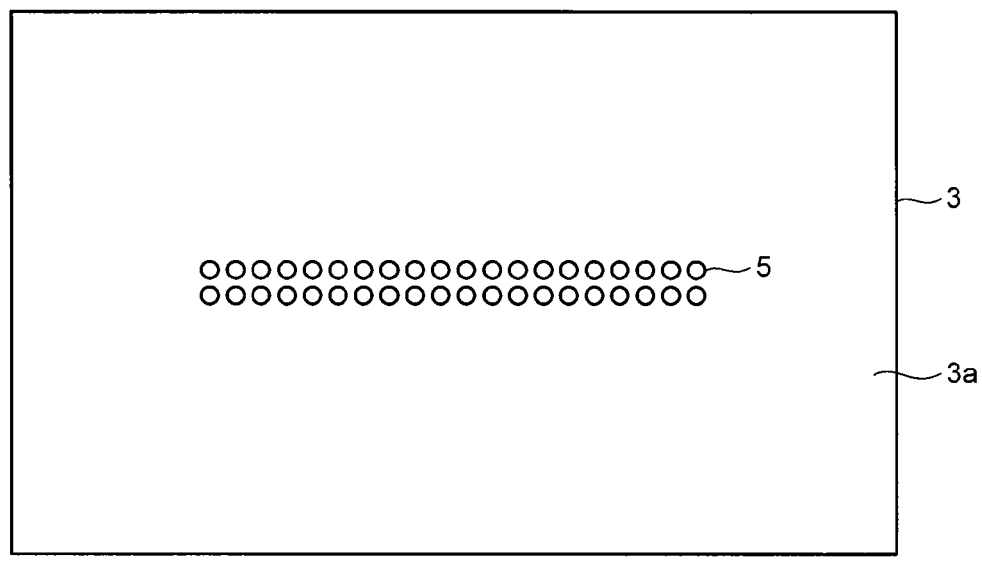
Figure 23:
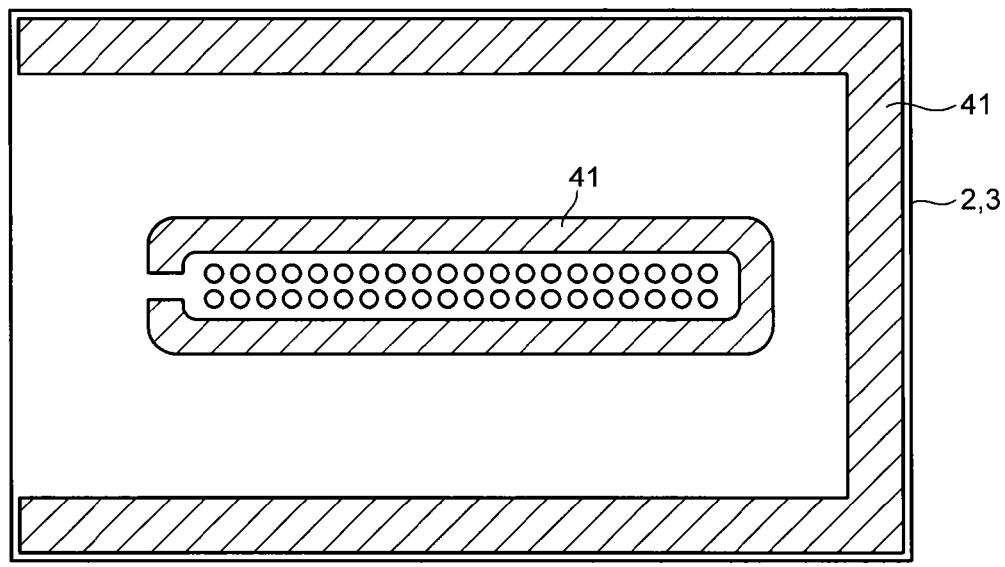
FIG. 23 is a plan perspective view illustrating a state in which the first semiconductor chip and the second semiconductor chip illustrated in FIG. 22A and FIG. 22B are combined.

FIG. 22A and FIG. 22B illustrate a disposition example of the stopper and bonding projections 41 having the side drop suppression function of the underfill resin. FIG. 22A illustrates the upper surface 2a of the first semiconductor chip 2. FIG. 22B illustrates the lower surface 3a of the second semiconductor chip 3. FIG. 23 illustrates a state in which the first semiconductor chip 2 and the second semiconductor chip 3 are combined. The stopper and bonding projections 41 are provided at outer peripheral regions of the semiconductor chip 2 and at a periphery of the bumps 4. The stopper and bonding projections 41 are disposed along the outer edge excluding the injection edge of the underfill resin at the outer peripheral region of the semiconductor chip 2. According to the stopper and bonding projections 41 as stated above, the side drop of the underfill resin from other than the injection edge of the underfill resin is suppressed.

When the stopper and bonding projections 41 are disposed along the three outer edges of the semiconductor chip 2, it is effective that the filling of the underfill resin is performed by a method in which it is released to the atmospheric pressure after filling under a reduced pressure, a method in which it is cured under pressurization after filling under the reduced pressure or the atmospheric pressure. These methods are methods in which voids generated at the filling time are crushed by a differential pressure. In particular, when the stopper and bonding projections 41 are disposed as illustrated in FIG. 22A, it is possible to effectively crush the voids because the pressure is added efficiently. The disposition of the bonding projections 8 illustrated in FIG. 20A, FIG. 20B and FIG. 21 may be applied to the stopper and bonding projections 41. The disposition of the stopper and bonding projections 41 illustrated in FIG. 22A, FIG. 22B and FIG. 23 may be applied to the bonding projections 8.

Fifth Embodiment

A configuration and a manufacturing process of a semiconductor device according to a fifth embodiment are described with reference to FIG. 24, FIG. 25A to FIG. 25C, FIG. 26A and FIG. 26B. A semiconductor device 50 according to the fifth embodiment includes an organic insulating film 51 provided at contact surfaces of the stopper projections 7 and the bonding projections 8, or contact surfaces of the stopper and bonding projections 41. The other configurations are basically the same as the first to third embodiments. The same reference numerals are used for the same parts as the first to third embodiments, and there is a case when apart of descriptions is not given. Here, the semiconductor device 50 using the stopper and bonding projections 41 is mainly described, but it is the same when the stopper projections 7 and the bonding projections 8 are applied.

Figure 24:
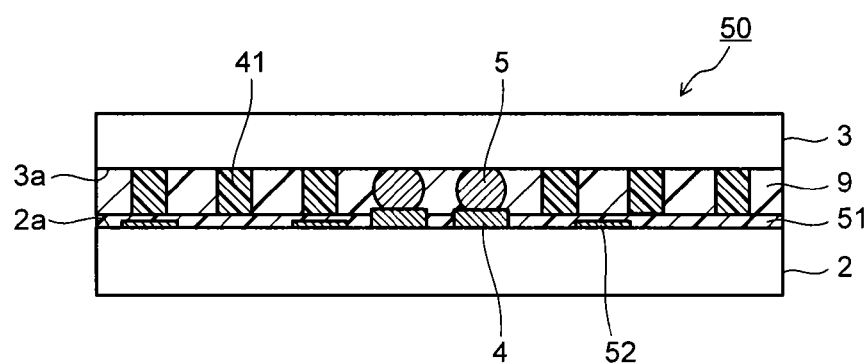
FIG. 24 is a sectional view illustrating a semiconductor device according to a fifth embodiment.

The semiconductor device 50 illustrated in FIG. 24 includes the first semiconductor chip 2 having the first bumps 4 and the second semiconductor chip 3 having the second bumps 5 and the stopper and bonding projections 41. The first semiconductor chip 2 and the second semiconductor chip 3 are electrically and mechanically connected via the bump connection parts 6 of the first bumps 4 and the second bumps 5. The stopper and bonding projections 41 are locally provided at the non-connection region in the lower surface 3a of the second semiconductor chip 3, and bonded to the first semiconductor chip 2. The underfill resin 9 is filled between the first semiconductor chip 2 and the second semiconductor chip 3.

There is a case when surface wirings 52 constituted by Al wiring film and so on are formed in addition to the first bumps 4 at the upper surface 2a of the first semiconductor chip 2. The surface wirings 52 are formed in accordance with a desired pattern, and therefore, there are parts where the surface wirings 52 exist and not exist. Projections and depressions of approximately 1 μm to 2 μm are generated at the upper surface 2a of the first semiconductor chip 2 depending on presence/ absence of the surface wiring 52. A gap is generated between the stopper and bonding projection 41 disposed at the part where the surface wiring 52 does not exist in the upper surface 2a of the first semiconductor chip 2, and it is impossible to make it function as the stopper and the bonding agent. The non-connection region in the upper surface 2a of the first semiconductor chip 2 is covered by the organic insulating film 51 in the semiconductor device 50 of the fifth embodiment.

The non-connection region in the upper surface 2a of the first semiconductor chip 2 is covered by the organic insulating film 51, and thereby, contact heights of the stopper and bonding projections 41 become even, and it becomes possible to let all of the stopper and bonding projections 41 function as the stopper and the bonding agent finely. For example, a thermosetting resin such as a polyimide based resin and a phenol based resin is applied as the organic insulating film 51. It is preferable that the organic insulating film 51 is made of the thermosetting resin of which cure temperature is 250° C. or less, for example, a low-temperature curing type polyimide resin and phenol resin. The organic insulating film 51 is formed by a coating process with a spin-coat, a lithography process, and a development process.

The organic insulating film 51 is formed at the contact surfaces of the stopper and bonding projections 41. The stopper and bonding projections 41 are provided at the lower surface 3a of the second semiconductor chip 3 in advance in the semiconductor device 50 illustrated in FIG. 24, and therefore, the organic insulating film 51 is provided at the non-connection region of the upper surface 2a of the first semiconductor chip 2. When the stopper and bonding projections 41 are provided at the upper surface 2a of the first semiconductor chip 2, the organic insulating film 51 is provided at the non-connection region at the lower surface 3a of the second semiconductor chip 3. It is also the same when the stopper projections 7 and the bonding projections 8 are applied instead of the stopper and bonding projections 41. The organic insulating film 51 is provided at the non-connection region at a surface of the semiconductor chip facing a chip surface where the stopper projections 7 and the bonding projections 8 are formed.

The organic insulating film 51 has an effect improving bonding reliability of the stopper and bonding projection 41 in addition to an effect uniformizing the heights of the contact surfaces of the stopper and bonding projections 41, in other words, planarizing the contact surfaces. The stopper and bonding projection 41 has a linear expansion coefficient of, for example, approximately 80 ppm/° C. to 200 ppm/° C., on the contrary, a linear expansion coefficient of an inorganic insulating film provided at the surface of the semiconductor chip 2 is, for example, approximately 0.1 ppm/° C. to 10 ppm/° C. When the organic insulating film 51 is not formed, peeling is easy to occur caused by a thermal expansion difference between the stopper and bonding projection 41 and the inorganic insulating film. On the other hand, the linear expansion coefficient of the organic insulating film 51 is, for example, approximately 40 ppm/° C. to 70 ppm/° C., and therefore, the thermal expansion difference with the stopper and bonding projection 41 is reduced. Accordingly, the peeling of the stopper and bonding projection 41 can be suppressed.

When the organic insulating film 51 is formed, it is possible to reduce the height of the stopper and bonding projection 41 according to a film thickness of the organic insulating film 51. When a thermal change occurs according to a surrounding environment and the like, variation in a height direction of the stopper and bonding projection 41 decreases, and therefore, the bonding reliability of the stopper and bonding projection 41 is improved. It is effective to form the organic insulating film 51 at a formation surface of the stopper and bonding projections 41 (the lower surface 3a of the second semiconductor chip 3) in addition to the bonding surface of the stopper and bonding projections 41 (the upper surface 2a of the first semiconductor chip 2). It is also the same when the stopper projections 7 and the bonding projections 8 are applied instead of the stopper and bonding projections 41.

Figure 25A:
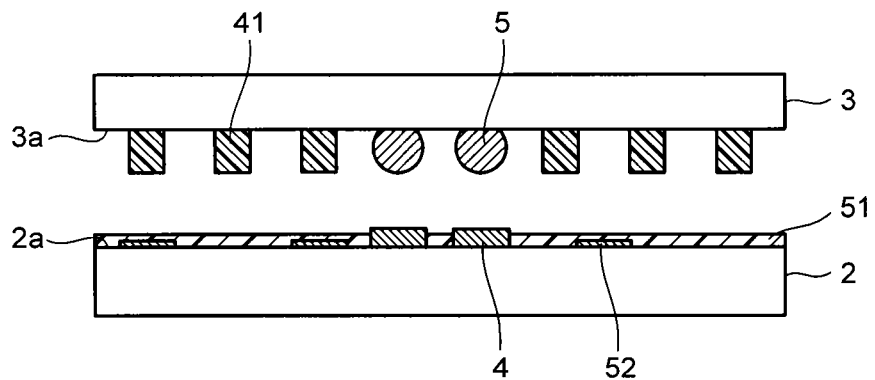
FIG. 25A to FIG. 25C are sectional views illustrating a manufacturing process of the semiconductor device according to the fifth embodiment.
Figure 26A:
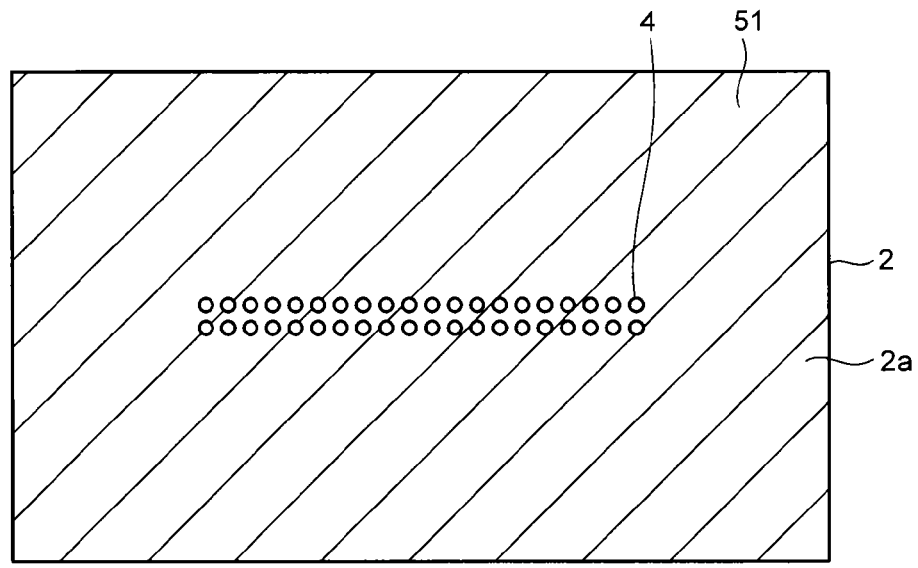
FIG. 26A and FIG. 26B are plan views illustrating bump formation surfaces of a first and a second semiconductor chip used for a manufacturing process of a sixth embodiment.
Figure 26B:
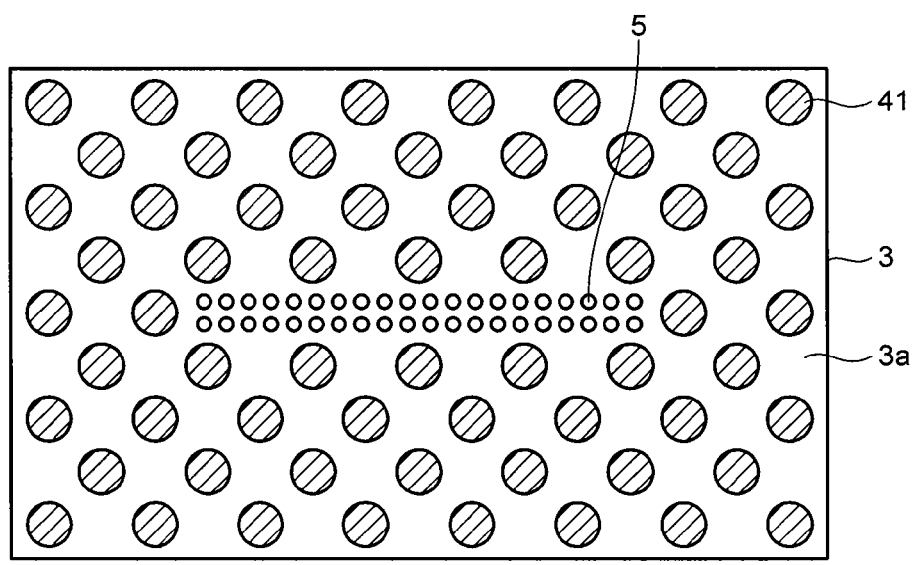

The semiconductor device 50 according to the fifth embodiment is, for example, manufactured as described below. As illustrated in FIG. 25A, the first semiconductor chip 2 including the first bumps 4 and the second semiconductor chip 3 including the second bumps 5 and the stopper and bonding projections 41 are prepared. A formation example of the stopper and bonding projections 41 and the organic insulating film 51 is illustrated in FIG. 26A and FIG. 26B. FIG. 26A illustrates the upper surface 2a of the first semiconductor chip 2. FIG. 26B illustrates the lower surface 3a of the second semiconductor chip 3. The organic insulating film 51 is formed at the non-connection region in the upper surface 2a of the first semiconductor chip 2, namely, at a whole region excluding the formation position of the bumps 4.

Figure 25B:
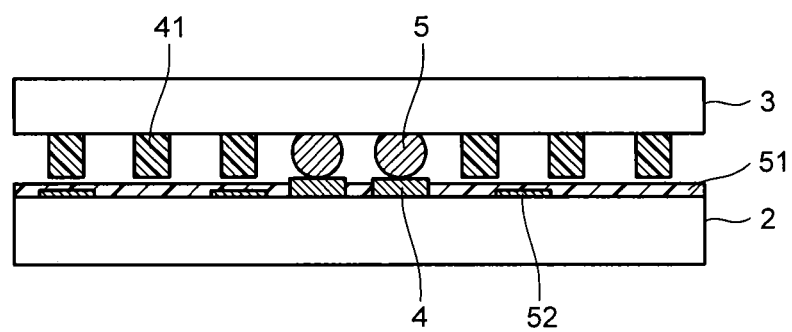
Figure 25C:
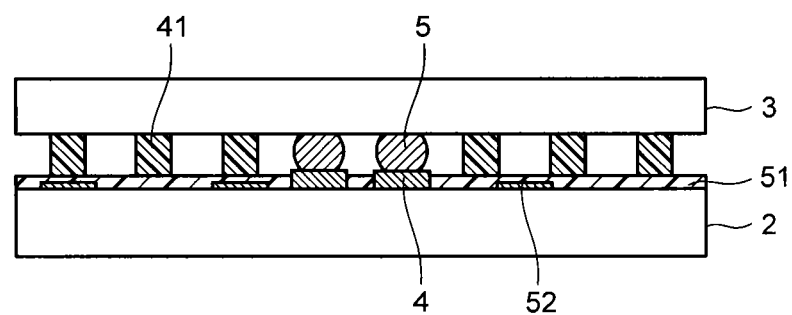

After the first semiconductor chip 2 and the second semiconductor chip 3 are aligned, the first bumps 4 and the second bumps 5 are brought into contact as illustrated in FIG. 25B, and further, the bumps 4, 5 are deformed until the stopper and bonding projections 41 are in contact with the organic insulating film 51. The first semiconductor chip 2 and the second semiconductor chip 3 are connected by applying a connecting method as same as the first or second connecting method in the first embodiment. The underfill resin 9 is filled into the gap between the first semiconductor chip 2 and the second semiconductor chip 3 and cured as same as the above-stated third embodiment, and thereby, the semiconductor device 50 is manufactured.

Here, a case when the two semiconductor chips 2, 3 are stacked is described, but it is the same when three or more semiconductor chips are stacked. A configuration when the three or more semiconductor chips are stacked is as described in the second and third embodiments. The configuration when the stopper projections 7 and the bonding projections 8 are applied instead of the stopper and bonding projections 41 is as illustrated in the first and second embodiments.

Note that the configurations of the first to fifth embodiments may be applied by combining each of them, and a part thereof can be replaced. Some embodiments of the present invention are described, but these embodiments are to be considered in all respects as illustrative and no restrictive. These embodiments may be embodied in other specific forms, and various omissions, replacements, changes can be performed without departing from the spirit or essential characteristics of the invention. These embodiments all changes which come within the meaning and range of equivalency of the claims are intended to be embraced therein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor chip having a first surface including a first electrical connection region and a first non-connection region excluding the first electrical connection region;
   a second semiconductor chip having a second surface including a second electrical connection region facing the first electrical connection region and a second non-connection region excluding the second electrical connection region, and stacked on the first semiconductor chip;
   first bump connection parts provided between the first electrical connection region of the first surface and the second electrical connection region of the second surface to electrically connect between the first semiconductor chip and the second semiconductor chip;
   first stopper projections locally formed on at least one region of the first non-connection region of the first surface and the second non-connection region of the second surface, and being in contact with the other region of the first non-connection region and the second non-connection region in an unbonded state;
   first bonding projections locally provided between the first non-connection region of the first surface and the second non-connection region of the second surface, and bonded to the first and second surfaces non-connection regions; and
   a first resin filled into a gap between the first surface of the first semiconductor chip and the second surface of the second semiconductor chip.

2. The semiconductor device according to claim 1, further comprising:
   a third semiconductor chip stacked on the second semiconductor chip,
   wherein the second semiconductor chip has a third surface opposed to the second surface, including a third electrical connection region and a third non-connection region excluding the third electrical connection region;
   wherein the third semiconductor chip has a fourth surface having a fourth electrical connection region facing the third electrical connection region and a fourth non-connection region excluding the fourth electrical connection region, and is stacked on the second semiconductor chip;
   wherein the second semiconductor chip and the third semiconductor chip are electrically connected by second bump connection parts provided between the third electrical connection region of the third surface and the fourth electrical connection region of the fourth surface;
   wherein second stopper projections locally formed on at least one region of the third non-connection region of the third surface and the fourth non-connection region of the fourth surface, and being in contact with the other region of the third non-connection region and the fourth non-connection region in an unbonded state, are disposed between the third surface of the second semiconductor chip and the fourth surface of the third semiconductor chip;
   wherein second bonding projections bonded to the third and fourth non-connection regions, are locally disposed between the third non-connection region of the third surface and the fourth non-connection region of the fourth surface; and
   wherein a second resin is filled into a gap between the third surface of the second semiconductor chip and the fourth surface of the third semiconductor chip.

3. The semiconductor device according to claim 2,
   wherein the second bump connection parts are electrically connected to the first bump connection parts via through electrodes provided in the second semiconductor chip.

4. The semiconductor device according to claim 1,
   wherein the first bonding projections are formed on at least one region of the first non-connection region of the first surface and the second non-connection region of the second surface, and an insulating film is provided on at least the other region of the first non-connection region and the second non-connection region.

5. The semiconductor device according to claim 1, further comprising:
   a substrate having a surface including connection terminals,
   wherein the first semiconductor chip has a fifth surface opposed to the first surface, including a fifth electrical connection region and a fifth non-connection region excluding the fifth electrical connection region, and is mounted on the substrate;
   wherein the substrate and the first semiconductor chip are electrically connected by third bump connection parts provided between the fifth electrical connection region of the fifth surface and the connection terminals of the substrate;
   wherein third stopper projections locally provided at least one of the fifth non-connection region of the fifth surface and the surface of the substrate, and being in contact with the other one of the fifth non-connection region and the surface of the substrate in an unbonded state, are disposed between the surface of the substrate and the fifth surface of the first semiconductor chip;
   wherein third bonding projections bonded to the surface of the substrate and the fifth surface, are locally disposed between the surface of the substrate and the fifth non-connection region of the fifth surface; and
   wherein third resin is filled into a gap between the surface of the substrate and the fifth surface of the first semiconductor chip.

6. A semiconductor device, comprising:
   a first semiconductor chip having a first surface including a first electrical connection region and a first non-connection region excluding the first electrical connection region;
   a second semiconductor chip having a second surface including a second electrical connection region facing the first electrical connection region and a second non-connection region excluding the second electrical connection region, and stacked on the first semiconductor chip;
   first bump connection parts provided between the first electrical connection region of the first surface and the second electrical connection region of the second surface to electrically connect the first semiconductor chip and the second semiconductor chip;
   first stopper and bonding projections locally formed on at least one region of the first non-connection region of the first surface and the second non-connection region of the second surface, and bonded to the other region of the first non-connection region and the second non-connection region; and
   a first resin filled into a gap between the first surface of the first semiconductor chip and the second surface of the second semiconductor chip.

7. The semiconductor device according to claim 6, further comprising:

a third semiconductor chip stacked on the second semiconductor chip, wherein the second semiconductor chip has a third surface opposed to the second surface, including a third electrical connection region and a third non-connection region excluding the third electrical connection region;

wherein the third semiconductor chip has a fourth surface including a fourth electrical connection region facing the third electrical connection region and a fourth non-connection region excluding the fourth electrical connection region, and is stacked on the second semiconductor chip;

wherein the second semiconductor chip and the third semiconductor chip are electrically connected by second bump connection parts provided between the third electrical connection region of the third surface and the fourth electrical connection region of the fourth surface;

wherein second stopper and bonding projections locally formed on at least one region of the third non-connection region of the third surface and the fourth non-connection region of the fourth surface, and bonded to the other region of the third non-connection region and the fourth non-connection region, are disposed between the third surface of the second semiconductor chip and the fourth surface of the third semiconductor chip; and wherein second resin is filled into a gap between the third surface of the second semiconductor chip and the fourth surface of the third semiconductor chip.

8. The semiconductor device according to claim 7,
wherein the second bump connection parts are electrically connected to the first bump connection parts via through electrodes provided in the second semiconductor chip.

9. The semiconductor device according to claim 6,
wherein the first stopper and bonding projections are formed on at least one region of the first non-connection region of the first surface and the second non-connection region of the second surface, and an insulating film is provided on at least the other region of the first non-connection region and the second non-connection region.

10. The semiconductor device according to claim 6, further comprising:
a substrate having a surface including connection terminals, wherein the first semiconductor chip has a fifth surface opposed to the first surface, including a fifth electrical connection region and a fifth non-connection region excluding the fifth electrical connection region, and is mounted on the substrate;

wherein the substrate and the first semiconductor chip are electrically connected by third bump connection parts provided between the fifth electrical connection region of the fifth surface and the connection terminals of the substrate;

wherein third stopper and bonding projections locally provided at least one of the fifth non-connection region of the fifth surface and the surface of the substrate, and being bonded to the other one of the fifth non-connection region and the surface of the substrate, are disposed between the surface of the substrate and the fifth surface of the first semiconductor chip; and wherein third resin is filled into a gap between the surface of the substrate and the fifth surface of the first semiconductor chip.

* * * * *